(12) United States Patent
Brown et al.

(10) Patent No.: US 6,239,627 B1
(45) Date of Patent: *May 29, 2001

(54) CLOCK MULTIPLIER USING NONOVERLAPPING CLOCK PULSES FOR WAVEFORM GENERATION

(75) Inventors: Andrew T. Brown, Ft. Collins; Nicholas P. Mati, Longmont, both of CO (US)

(73) Assignee: VIA-Cyrix, Inc., Richardson, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/919,702

(22) Filed: Aug. 28, 1997

Related U.S. Application Data

(63) Continuation of application No. 08/790,125, filed on Jan. 29, 1997, now abandoned, which is a continuation of application No. 08/590,067, filed on Jan. 17, 1996, now abandoned, which is a continuation of application No. 08/367,621, filed on Jan. 3, 1995, now abandoned.

(51) Int. Cl.[7] .................................................. H03B 19/00
(52) U.S. Cl. ............................ 327/116; 327/119; 327/295
(58) Field of Search .................................... 327/116, 217, 327/292, 295, 141, 239, 270–273, 119–122; 331/1 A, 17, 25, 57; 375/118, 119

(56) References Cited

U.S. PATENT DOCUMENTS

| | | | | |
|---|---|---|---|---|
| 3,961,269 | * | 6/1976 | Alvarez, Jr. ............................ | 327/239 |
| 4,386,323 | * | 5/1983 | Jansen ................................... | 327/152 |
| 4,463,440 | * | 7/1984 | Nishiura et al. ....................... | 395/550 |
| 4,554,465 | * | 11/1985 | Kolke .................................... | 327/258 |
| 4,654,599 | * | 3/1987 | Zbinden et al. ....................... | 327/142 |
| 4,675,612 | * | 6/1987 | Adams et al. ......................... | 327/142 |
| 4,713,621 | * | 12/1987 | Nakamura et al. .................... | 327/152 |
| 4,719,365 | * | 1/1988 | Misono ................................. | 327/154 |
| 4,758,737 | * | 7/1988 | Hirano .................................. | 327/115 |
| 4,877,974 | * | 10/1989 | Kawai et al. .......................... | 327/239 |
| 5,329,559 | * | 7/1994 | Wong et al. ........................... | 375/119 |
| 5,570,294 | * | 10/1996 | McMinn et al. ....................... | 327/270 |
| 5,633,608 | * | 5/1997 | Danger .................................. | 327/270 |
| 5,684,421 | * | 11/1997 | Chapman et al. ..................... | 327/270 |
| 5,812,832 | * | 9/1998 | Horne et al. .......................... | 395/556 |

* cited by examiner

Primary Examiner—Kenneth B. Wells
(74) Attorney, Agent, or Firm—Carr & Ferrell LLP

(57) ABSTRACT

An improved clock generator performs clock multiplication using selectable generation of clock edges. A clock multiplier divides an input clock period into N edges by generating N non-overlapping clock pulses synchronized to the period of the reference clock—these edges are selectably combined to produce an output clock with the desired multiplication and duty cycle. The sequence of non-overlapping pulses is synchronized to the period of the input reference clock, i.e., to the first harmonic of the reference clock. A pulse generator network includes N pulse generators PG1–PGN, with the output of each pulse generator being coupled to the input of the next pulse generator. When triggered, each pulse generator generates a pulse P with a leading edge and a trailing edge, and a pulse width determined by a selectable pulse-width delay signal. The pulse generator PG1 is triggered by a leading edge of the reference clock, and the remaining pulse generators PG2–PGN are triggered by the trailing edge of the pulse P from the previous pulse generator. A synchronization circuit detects phase deviations between the trailing edge of the pulse PN from pulse generator PGN and the leading edge of the reference clock, and provides a corresponding phase adjustment signal used to adjust the pulse-width delay signal for at least one of the pulses P so as to achieve phase locking.

3 Claims, 18 Drawing Sheets

CLOCK MULTIPLIER USING NONOVERLAPPING CLOCK PULSES FOR WAVEFORM GENERATION

CROSS REFERENCES TO RELATED APPLICATIONS

The present application is a file wrapper continuation of application Ser. No. 08/790,125, filed Jan. 29, 1997, now abandoned, which was a file wrapper continuation of Ser. No. 08/590,067, filed Jan. 17, 1996, now abandoned, which was a file wrapper continuation of Ser. No. 08/367,621 filed Jan. 3, 1995, now abandoned. This patent application is related to the following co-pending U.S. patent applications, all assigned to the assignee of this application, and all of which are incorporated by reference: (a) Ser. No. 08/367,624, titled "PLL Clock Generator Including Digital Skew Compensation With Separate Leading And Trailing Edge Delay Lines", filed Dec. 30, 1994, (b) Ser. No. 08/368,073, titled "PLL Clock Generator Using Phase Detection With Hysteresis To Achieve Phase Locking", filed Dec. 30, 1994, (c) Ser. No. 08/368,227, titled "PLL Clock Generator Using Phase Detection With Up/Down and Phase Lock Signaling", filed Dec. 30, 1994, (d) Ser. No. 08/367,623, titled "Digital Delay Line Including Multiple Delay Outputs From A Single Tapped Inverter Chain", filed Dec. 30, 1994, and (e) Ser. No. 08/368,072, titled "Process Invariant Digital Delay Line Including Process Sensitive Front-End To Measure Process Variations", filed Dec. 30, 1994.

BACKGROUND

1. Technical Field

The invention relates generally to integrated circuits, and more particularly relates to a digital phase lock loop clock generator including clock multiplication.

In an exemplary embodiment, the clock generator provides internal clock generation for a single chip memory and bus controller used in a computer system based on an x86 microprocessor architecture, generating (a) a 1× (66 MHz) clock for interfacing to the microprocessor local (system) bus, and (b) ½× (33 MHz) or ⅔× (40 MHz) clock for interfacing to a VL peripheral bus.

2. Related Art

Clock generation and distribution schemes for large scale integrated circuits commonly use phase locked loops (PLLs) to synchronize to an input reference clock. Synchronization is obtained by phase locking the generated output clock to the input reference clock (using feedback of the output clock), where the output clock is generated using either of two design approaches: (a) analog using a voltage controlled oscillator, or (b) digital using a digital skew compensator.

Without limiting the scope of the invention, this background information is provided in the context of a specific problem to which the invention has application: providing an improved digital clock generator that (a) performs skew compensation with accurate control over duty cycle, (b) achieves phase locking with minimized jitter, and (c) performs clock multiplication with accurate control over output clock edge generation.

PLLs using voltage controlled oscillators (VCOs) are sensitive to electrical noise on the chip and on ground/voltage reference points. As integrated circuit speeds increase, designing a stable VCO becomes problematic, particularly in view of process variations during chip fabrication, such that the PLL can be a significant contributor to yield loss. Moreover, VCOs typically require a long lock delay between the time the reference clock is present and the time the PLL clock is fully in lock (synchronized) with minimum skew and a stable frequency.

Digital PLL designs have been able to overcome many of the disadvantages of PLLs based on VCOs. In the typical digital PLL design, phase locking is achieved using phase detection to detect alignment (or misalignment) of the generated and reference clocks, and a skew compensation to introduce an appropriate amount of delay through the clock generator to compensate for input reference clock delay through the input pads, clock trees, etc.

Skew compensators typically use a digital delay line with a tapped inverter chain—the output tap is adjusted to introduce a selected amount of delay. The phase detector is used to provide an up/down delay selection signal to the skew compensator—the delay selection signal indicates whether the output delay should be increased or decreased (i.e., adjusted up or down )to achieve phase locking. One problem with current digital PLL designs is minimizing any change in duty cycle introduced by skew compensation—the tapped inverter chains used in the skew compensators can alter duty cycle because rising and falling clock edges may propagate through the inverters with different transition times. Another problem is jitter in the generated output clock introduced by phase detection—as the phase detector attempts to achieve phase locking, small changes in the alignment of the reference and feedback (generated) clocks can result in overcompensating up/down adjustments that translates into jitter in the generated clock.

Systems often include clock generators with multiplication logic to provide internal generated clocks that are some multiple of the input reference clock. For example, in the case of a memory and bus controller, interface to a microprocessor may be at 1× the system clock (e.g., 66 mhz), but interface to a peripheral bus (such as a 33 or 40 MHz VL-bus) may be at ½× or ⅔×—the ⅔× fractional multiplication would be provided by a 2× multiply and a divide-by-three.

Current clock multiplication schemes commonly employ analog components to accurately generate a predetermined number of clock edges each clock period from the leading edge of an input clock (i.e., the PLL generated clock)—these clock edges are combined in an output waveform generator to provide an appropriately multiplied clock (i.e., for 2× multiplication, four clock edges are generated). Fully digital schemes using delay lines are available—the leading edge of the input clock is fed back with an appropriate delay a predetermined number of times to generate a corresponding number of edges.

Because even digital PLLs are sensitive to process variations that result in operational variations, systems using clock generation commonly include process variation detection structures. One common approach is to provide a digital delay line with a tapped inverter chain in which the inverters are process sensitive (i.e., including combinations of process layers such as metal 1, metal 2, poly)—the delay through the inverter chain is then a measure of process variation. These delay line structures, because they are by design process sensitive, are typically not used for any function other than process variation measurement.

SUMMARY

An object of the invention is to provide an improved clock generator including clock multiplication using selectable generation of clock edges.

This and other objects of the invention are achieved by a clock generator including a clock multiplier that generates a multiplied clock with a frequency that is a multiple of the frequency of the reference clock.

In one aspect of the invention, the clock multiplier includes a pulse generator network of N pulse generators PG1–PGN, with the output of each pulse generator being coupled to the input of the next pulse generator. When triggered, each pulse generator generates a pulse P with a leading edge and a trailing edge, and a pulse width determined by a selectable pulse-width delay signal.

The pulse generator PG1 is triggered by a leading edge of the reference clock, and the remaining pulse generators PG2–PGN are triggered by the trailing edge of the pulse P from the previous pulse generator.

A synchronization circuit detects phase deviations between the trailing edge of the pulse PN from pulse generator PGN and the leading edge of the reference clock, and provides a corresponding phase adjustment signal. A pulse-width delay selection circuit is responsive to the phase adjustment signal to correspondingly adjust the pulse-width delay signal for at least one of the pulses P so as to achieve phase locking between the reference clock and the pulse PN, such that, for each period of the reference clock, the pulse generator network generates a sequence of non-overlapping pulses P1–PN.

A waveform generator is responsive to selected ones of the pulses P1–PN to generate the multiplied clock with clock edges defined by such selected ones of the pulses P1–PN.

Embodiments of the invention may be implemented to realize one or more of the following technical advantages. The clock generator includes a clock multiplier that divides an input clock period into N edges by generating N non-overlapping clock pulses synchronized to the period of the reference clock—these edges are selectably combined to produce an output clock with the desired multiplication and duty cycle. The sequence of non-overlapping pulses is synchronized to the period of the input reference clock, i.e., to the first harmonic of the reference clock.

For a more complete understanding of the invention, and for further features and advantages, reference is now made to the Detailed Description of an exemplary embodiment of the invention, together with the accompanying Drawings, it being understood that the invention encompasses any modifications or alternative embodiments that fall within the scope of the claims.

DRAWINGS

FIGS. 4a–4f provide additional detail for the digital skew compensator (DSC), including (4a) DSC control logic including cycle qualifier, phase detector (with phase lock output signal), and synchronous counter, (4b/4c) state and timing diagrams for the cycle qualifier, (4d) an exemplary logic implementation for the phase detector using hysteresis to achieve phase locking, (4e) an exemplary logic implementation for the synchronous counter, and (4f) an exemplary logic implementation for the skew compensation delay lines configured for process variation measurement.

Figure 5A:
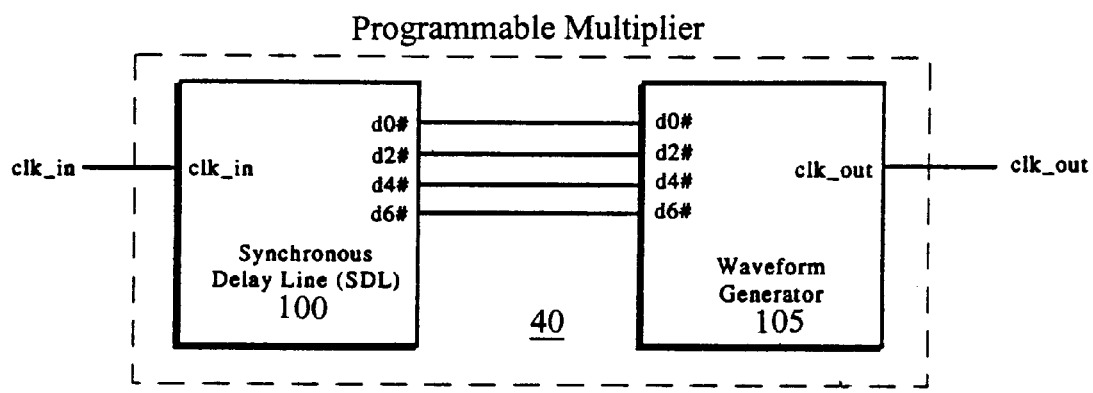

FIG. 5a illustrates the exemplary programmable 2× multiplier, including a synchronous delay line and an output waveform generator.

Figure 5B:
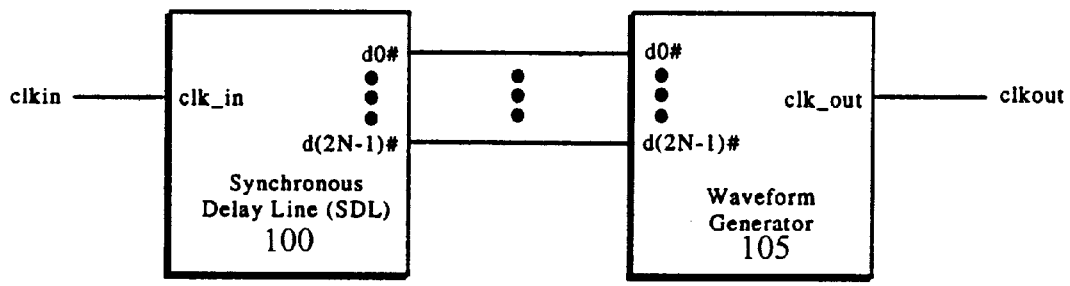

FIG. 5b illustrates the extension of the programmable multiplier to multiply-by-N.

Figure 6A:
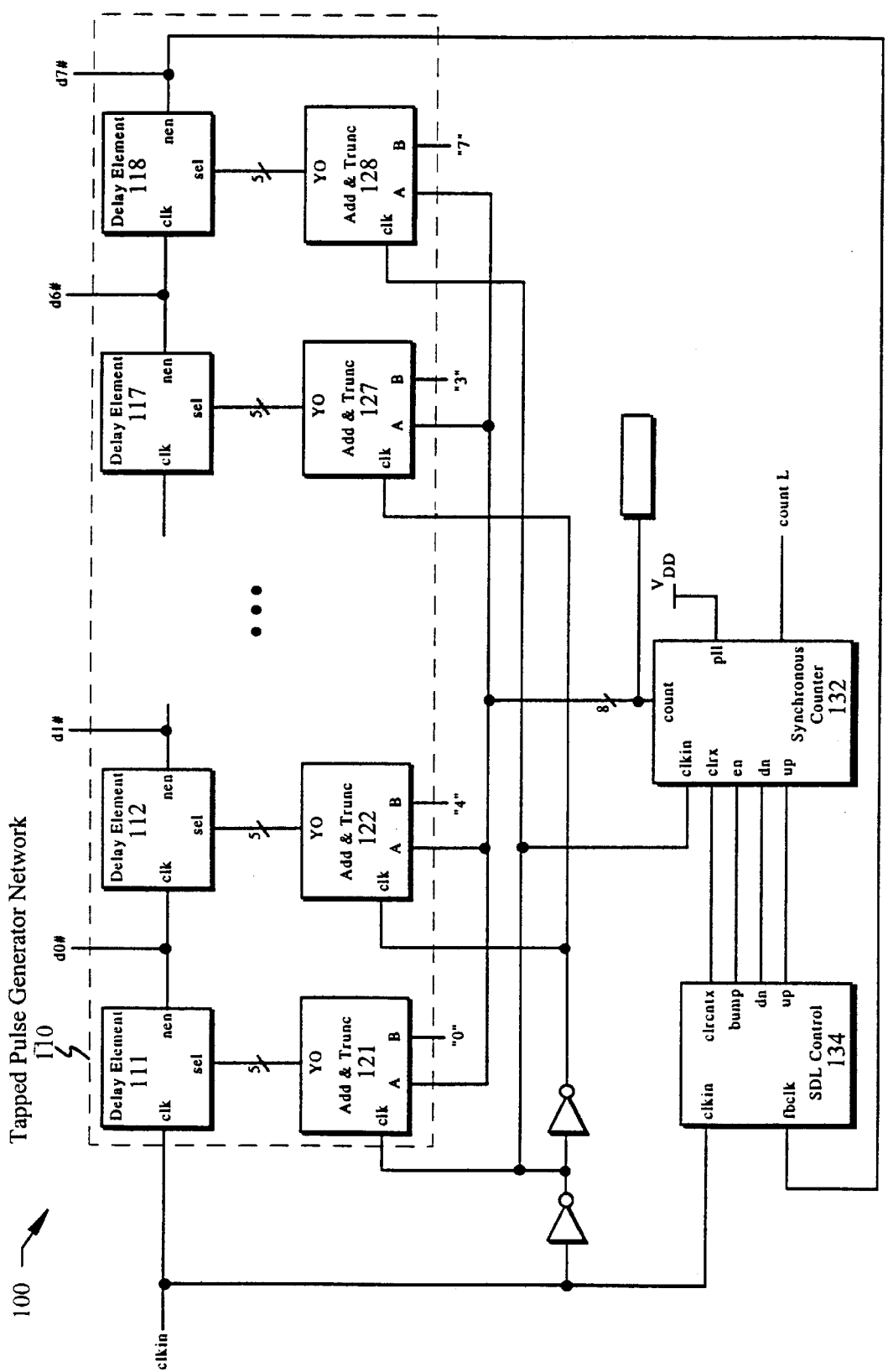
Figure 6B:
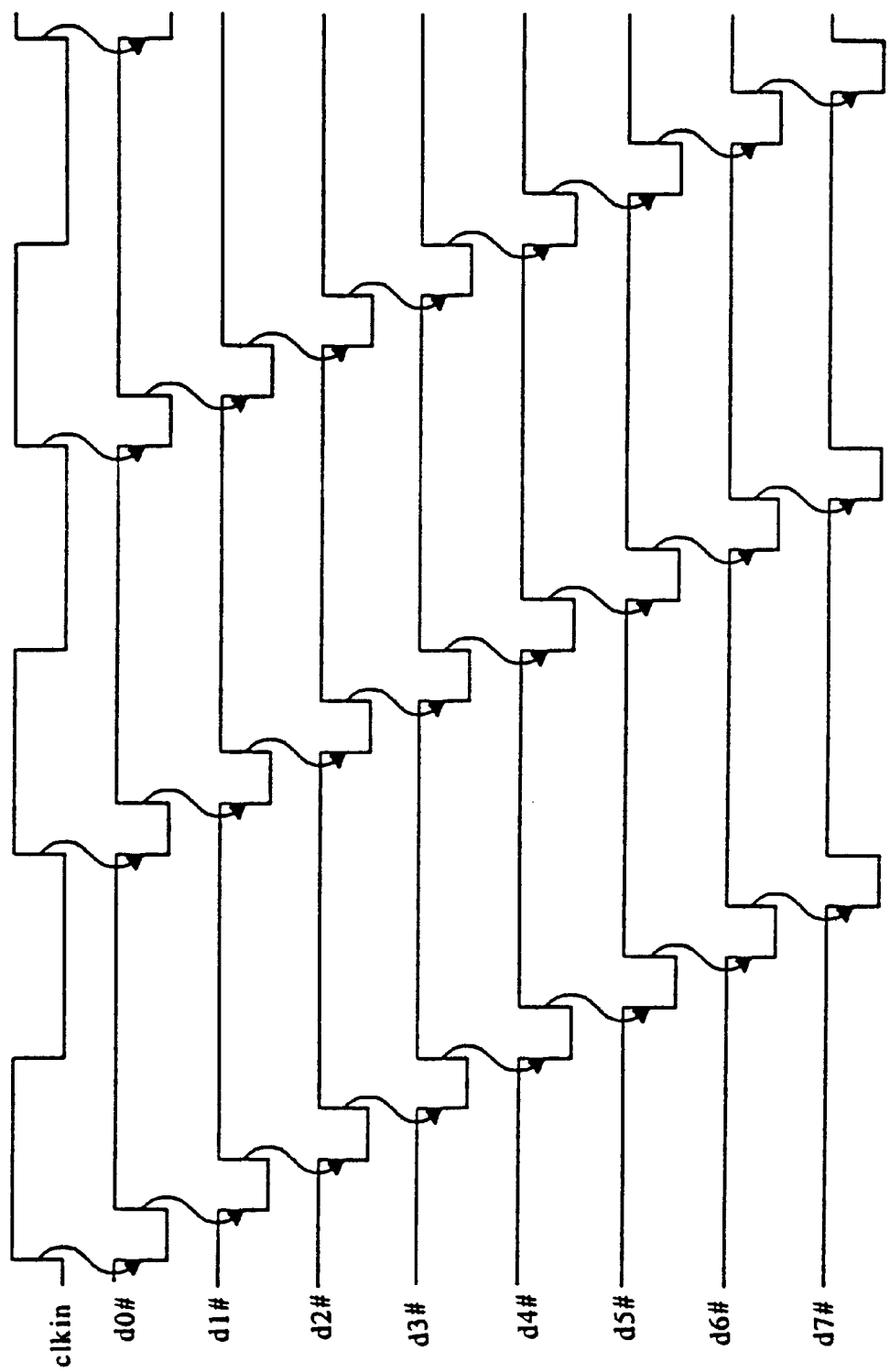

FIGS. 6a and 6b illustrate a logic implementation and timing diagram for the exemplary synchronous delay line (SDL), including non-overlapping pulse generation network, SDL control logic, and synchronous counter.

FIGS. 7a–7f provide additional detail for the exemplary synchronous delay line (SDL), including (7a) SDL control logic including cycle qualifier and phase detector, (7b) add and truncate logic in the pulse generation network, (7c/7d) delay element logic (configured for process variation measurement) and associated timing diagram, and (7e/7f) chain circuit logic in the delay element and associated timing diagram.

Figure 8A:
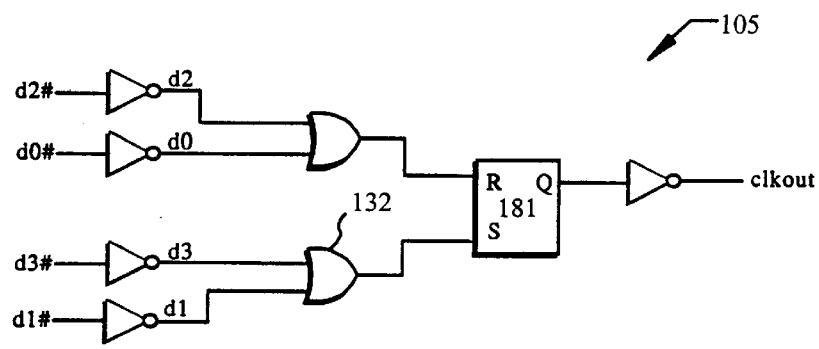
Figure 8B:
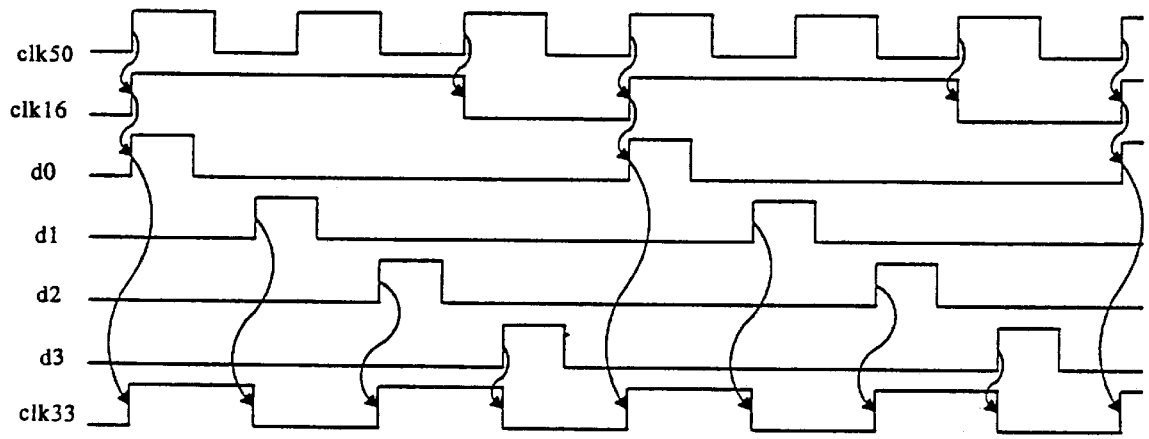

FIGS. 8a and 8b illustrate a logic implementation and exemplary timing diagram for the output waveform generator which uses selected clock pulses from the synchronous delay line to generate a 2× output clock.

DETAILED DESCRIPTION

The detailed description of an exemplary embodiment of the clock generator including a clock multiplier using non-overlapping clock pulses, is organized as follows:

1. Clock Generator
2. Digital Skew Compensation
    2.1. DSC Control Logic
    2.2. Phase Detector
        2.2.1. Phase Lock Signal
        2.2.2. Hysteresis
    2.3. Synchronous Counter
    2.4. Digital Delay Line
        2.4.1. Multiple Delay Outputs
        2.4.2. Process Variation
3. Clock Multiplication
    3.1. Synchronous Delay Line
        3.1.1. SDL Control Logic
        3.1.2. Add and Truncate
        3.1.3. Delay Element
    3.2. Waveform Generator
    3.3. Fractional Multiplication
4. Conclusion Appendix A—Counter State Table
Appendix B—Selector Truth Table This organizational outline, and the corresponding headings used in this Detailed Description, are provided for convenience of reference only.

The exemplary clock generator provides internal clock generation for a memory and bus controller used in a computer system based on the x86 microprocessor architecture, generating both a 1× clock for interfacing to the microprocessor local bus (66 mhz) and ½× (33 mhz) and ⅔× (40 MHz) clock for interfacing to a VL peripheral bus. Detailed descriptions of conventional or known aspects of digital clock generation and multiplication are omitted so as to not obscure the description of the invention.

Acronyms used in this Detailed Description include:

DSC digital skew compensator
SCDL skew compensation delay line
SDL synchronous delay line
A&T add and truncate The symbol # used with a signal designator denotes active low. The symbol h with numbers or letters is used to indicate hexadecimal.

1. Clock Generator

Figure 1:
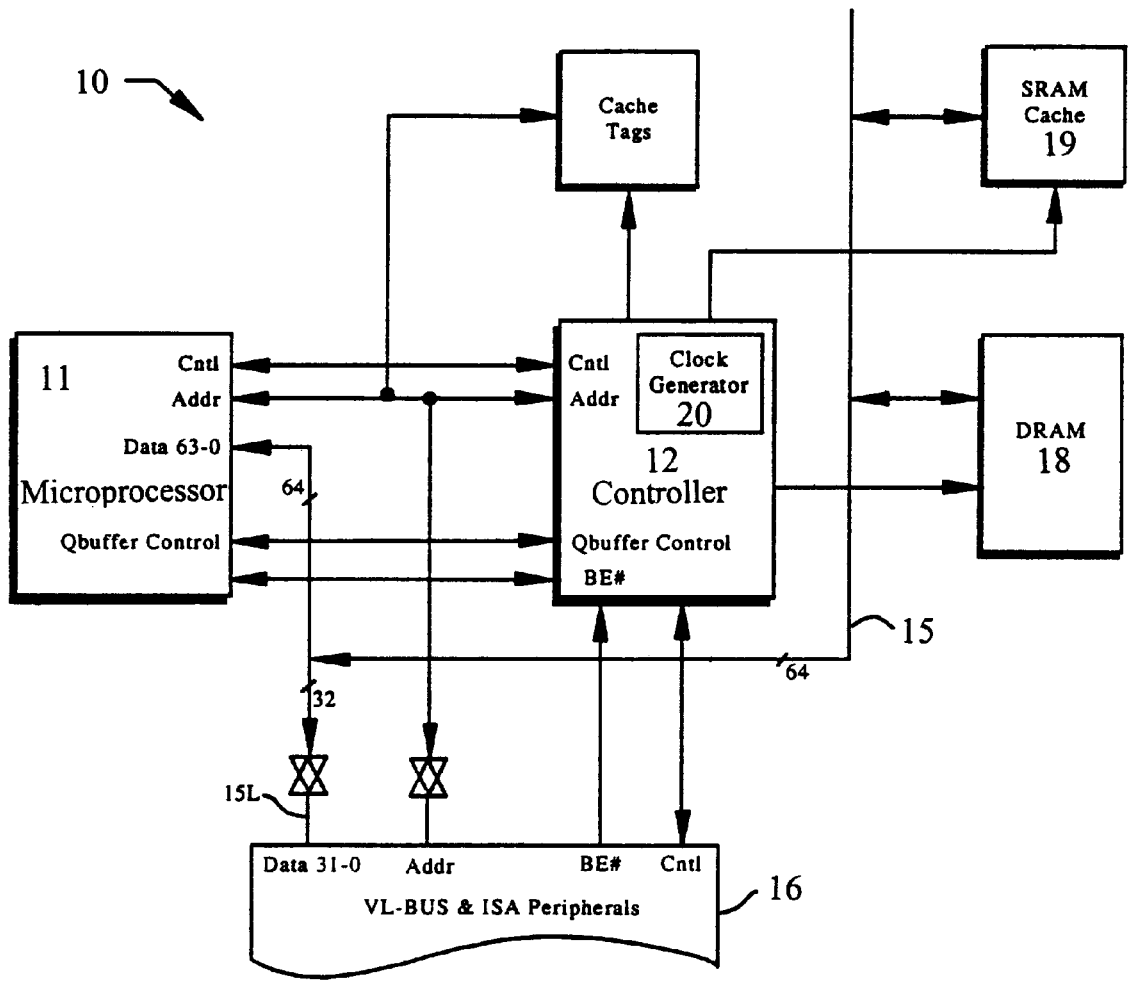
FIG. 1 illustrates a computer system including a memory and bus controller using a digital phase locked loop clock generator according to the invention.

FIG. 1*a* illustrates an exemplary computer system 10 including a microprocessor 11 and associated memory/bus controller 12. The microprocessor (CPU) interfaces to (a) a processor local (system) bus 15, and (b) a Peripheral bus 16—the 32-bit Peripheral bus interfaces to the low dword 15L of the processor local bus.

The memory/bus controller 12 interfaces the microprocessor 11 to a memory subsystem including DRAM 18 and level 2 (L2) cache 19 over the processor local bus 15, and in addition, implements a CPU-Peripheral bus interface (Qbuffer) protocol. For the exemplary embodiment, the microprocessor memory/bus controller interfaces directly to a standard VL Peripheral bus, and through a standard VL/ISA bus converter (not shown) to an ISA Peripheral bus.

The exemplary computer system uses a 66 MHz system clock, with the local bus 15 running at 66 mhz, and the VL peripheral bus running at either 33 or 40 MHz.

The memory/bus controller 12 includes a digital phase locked loop (PLL) clock generator according to the invention. The clock generator generates a 1× bus clock for interfacing to the microprocessor 11 over local bus 15 at 66 mhz, and either a ½× (33 mhz) or ⅔× (40 mhz) peripheral bus clock for interfacing to VL peripheral bus 16.

Figure 2:
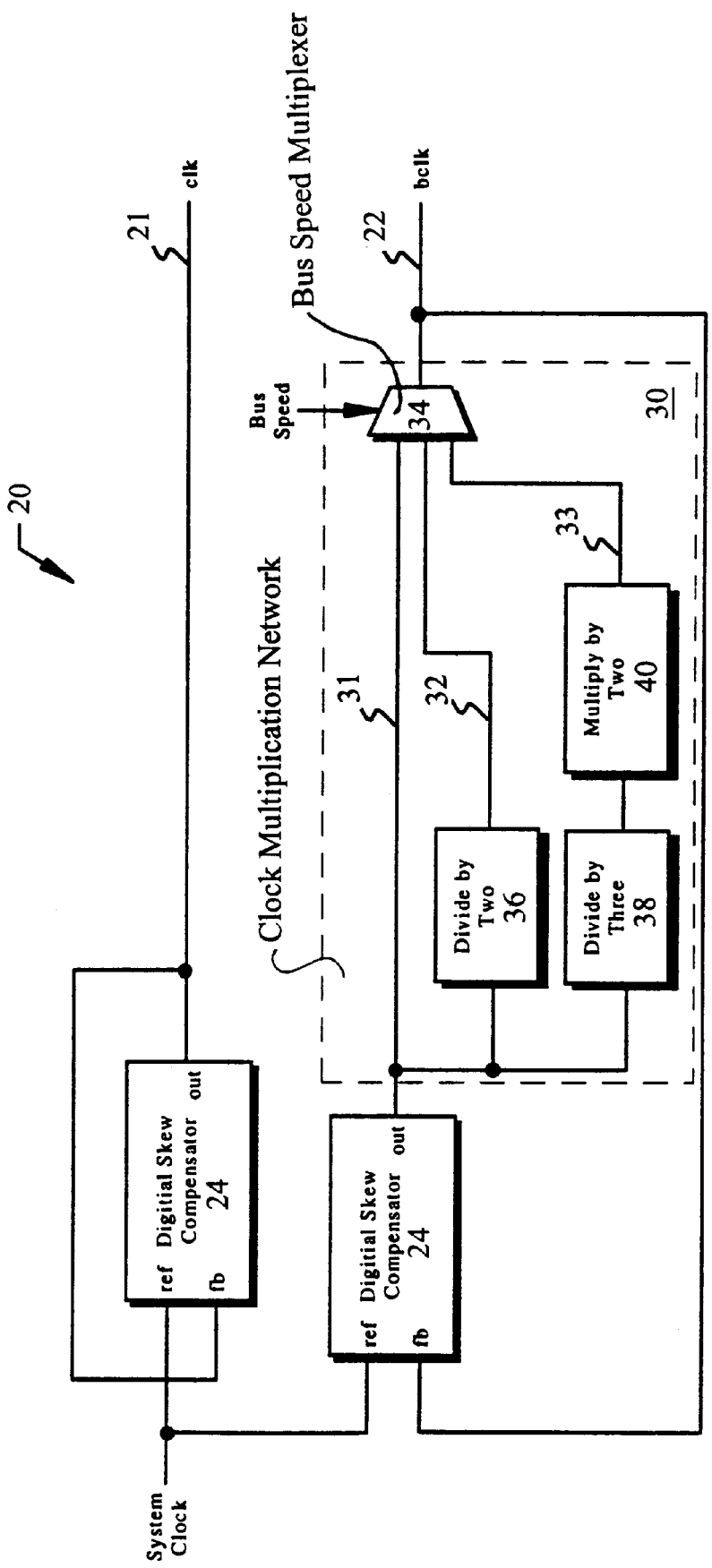
FIG. 2 illustrates the exemplary clock generator, including digital skew compensator and programmable clock multiplier configured to provide 1×, ½× and ⅔× clock outputs.

FIG. 2 illustrates the exemplary clock generator 20. The clock generator includes two generated clock lines: (a) a local bus clock line 21 generates a 1X local bus clock clk, and (b) a peripheral bus clock line 22 generates a peripheral bus clock bclk.

Each clock line includes respective digital skew compensators 24 which are identical. The peripheral bus clock line 22 includes a programmable clock multiplication network 30 that selectively provides 1×, ½×, or ⅔× peripheral bus clocks.

The exemplary clock multiplication network 30 selectively provides three separate peripheral bus (bclk) clock lines: (a) a 1× click line 31, (b) a ½× clock line 32, and (c) a ⅔× clock line 33. A bus speed multiplexer 34 selects the desired speed for the output bclk.

The ½× clock line 32 includes divide-by-two logic 36. The ⅔× clock line 33 includes divide-by-three logic 38, and multiply-by-two logic 40. The 1× clock line 31 provides a 1× bclk option for use with higher performance peripheral buses.

The clock generator 20 receives the 66 mhz system reference clock, which is input to both digital skew compensators 24.

2. Digital Skew Compensation

Figure 3:
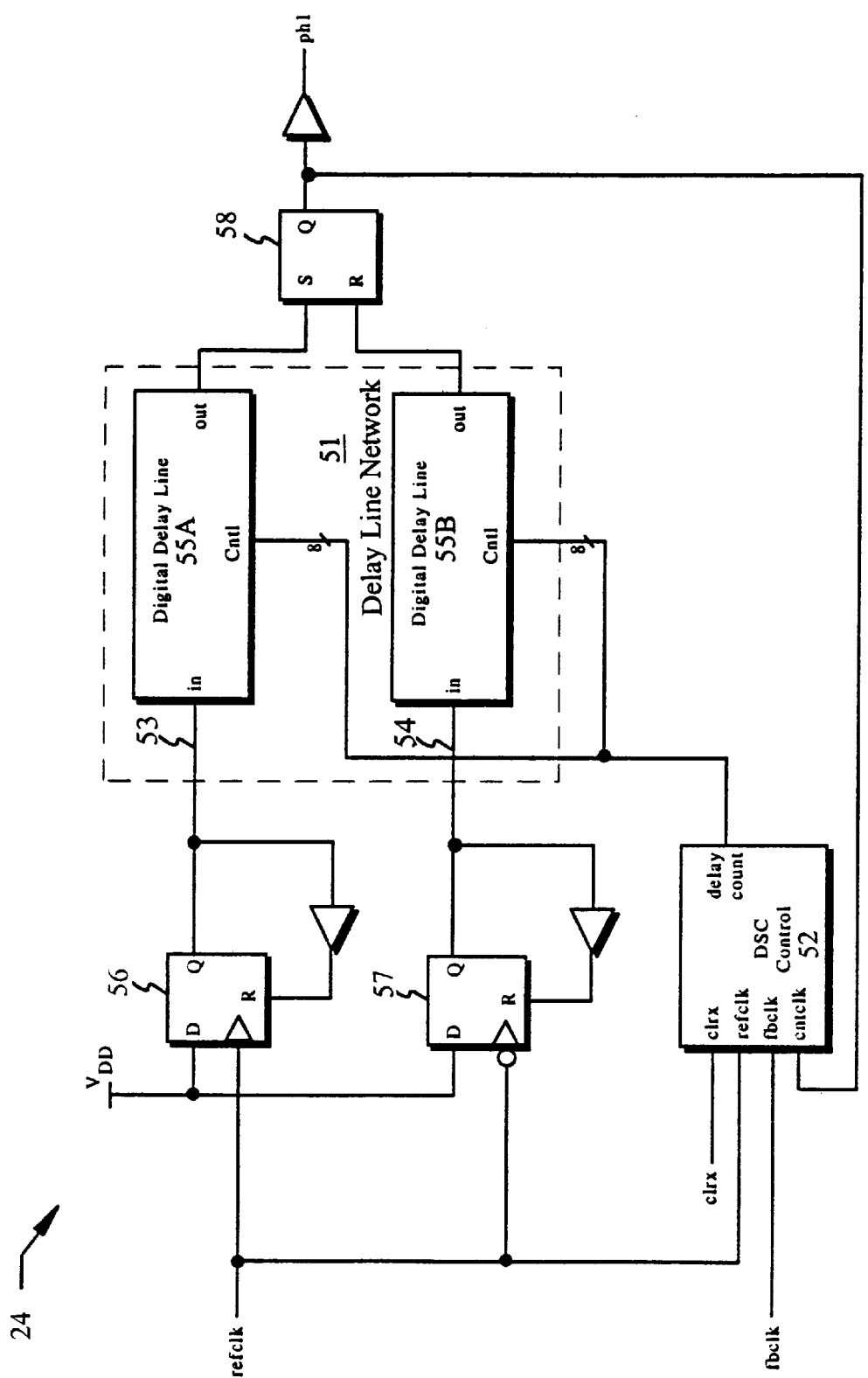
FIG. 3 illustrates the exemplary digital skew compensator including separate leading edge and trailing edge skew compensation delay lines.

FIG. 3 illustrates the principal components of the exemplary digital skew compensator (DSC) 24. The DSC performs clock skew compensation by introducing a selected (adjustable) amount of skew compensation delay (to compensate for clock delay through the input pads, clock trees, etc.) so as to align the clock edges of the reference clock refclk and a feedback clock fbclk.

The amount of skew compensation delay is determined by a delay line network 51—DSC control logic 52 adjusts the amount of skew compensation delay to achieve phase locked synchronization of a generated output clock ph1 with the input refclk. The generated clock ph1 is a delayed version of the reference clock, with the same frequency and duty cycle.

In accordance with one aspect of the invention, the delay line network 51 includes separate leading (rising) edge and trailing (falling) edge skew compensation sections 53 and 54. Each section includes identical skew compensation delay lines (SCDL) 55A and 55B—each SCDL uses an inverter chain to produce a selected amount of delay (see Section 2.4).

SCDL 55A is used to delay the leading edge of the input refclk, while SCDL 55B is used to delay the trailing edge of refclk. As a result, the effect on duty cycle of differing leading edge and trailing edge transition times through the inverter chains in the SCDLs is avoided.

The reference clock is separated into leading edge and trailing edge events by flip-flops 56 and 57. The leading edge of refclk propagates through SCDL 55A to the set input of an output flip-flop 58, while the trailing edge of refclk propagates through SCDL 55B to the reset input of the output flip-flop.

The selectively delayed leading edge sets the output flip-flop 58, generating a leading edge of the generated output clock ph1. The selectively delayed trailing edge resets the output flip-flop, generating the trailing edge of ph1.

For both SCDLs, the length of the delay is determined by a delay_count (delay selection) signal generated by the DSC control logic 52 (see, Section 2.1). The clrx signal resets the DSC control logic to its reset state.

2.1 DSC Control Logic

Figure 4A:
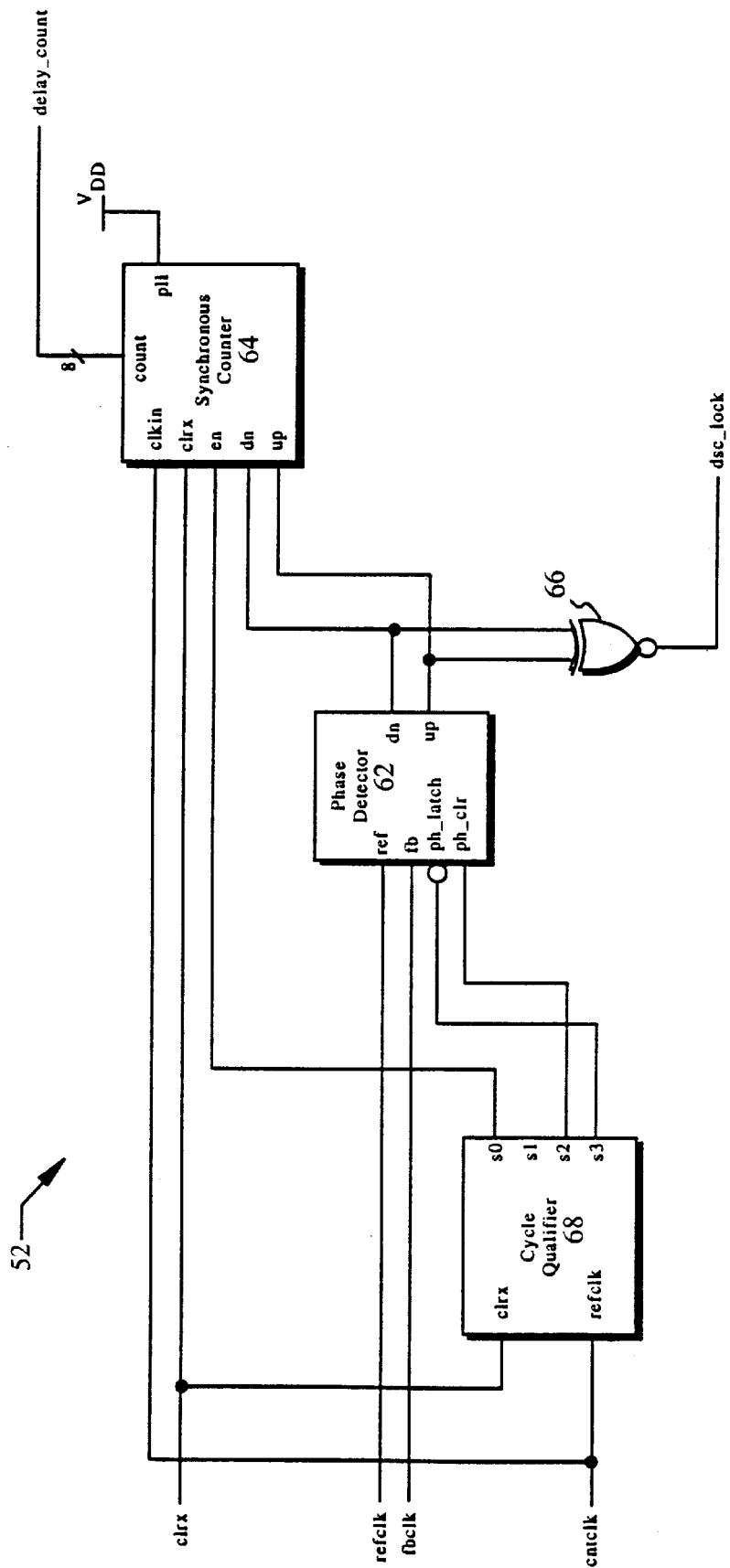

FIG. 4*a* illustrates the principal components of the exemplary DSC control logic 52, used to establish the amount of skew compensation delay introduced by the DSC. The DSC control logic compares the reference clock refclk and feedback fbclk frequencies, and provides the delay_count signal used to adjust the skew compensation delay introduced by the leading and trailing edge SCDLs (55A and 55B in FIG. 3).

Phase detector 62 determines if the feedback clock fbclk is leading, lagging, or phase locked with refclk, and correspondingly provides up/dn output data to control the amount of skew-compensation delay necessary to achieve phase locking.

A synchronous counter 64 reads the up/dn data to adjust the value of delay_count to correspondingly control the amount of skew-compensation delay through the leading and trailing edge SCDLs. In response to the up/dn data from the phase detector 62, the counter will increment or decrement delay_count, or leave it unchanged (phase locked).

The phase detector 62 receives both refclk and fbclk, and depending on the state of synchronization between these clocks, provides up/dn output data. If refclk leads fbclk, the phase detector signals dn to cause the synchronous counter 62 to decrement delay_count. If refclk lags fbclk, the phase detector signals up to cause the counter to increment delay_count. If refclk and fbclk are in phase, the phase detector signals phase lock and delay_count is not changed.

In accordance with one aspect of the invention, the exemplary phase detector 62 uses hysteresis in the generation of up/dn/lock signals, achieving phase locking while minimizing the amount of jitter introduced by adjusting the skew-compensation delay. Hysteresis in the phase detector prevents signaling a change in skew-compensation delay when the discrepancy between refclk and fbclk is less than the delay between taps on the SCDL inverter chain—rather, in this case, the phase detector will continue to signal a phase locked condition. As a result, phase locking is achieved while jitter is minimized by avoiding overcompensating for small deviations for lock.

The exclusive-nor gate 66 sends a dsc_lock signal to the rest of the system to indicate when the phase detector is signaling phase lock.

A four phase cycle qualifier 68 is a state machine that keeps track of the current cycle for the DSC. It controls the latching and clearing of data by phase detector 62, and enables the synchronous counter 64 when data from the phase detector is valid.

In the exemplary system, the feedback frequency may be 1x, ½x or ⅔x the reference frequency. Therefore, the cycle qualifier must keep track of six cycles because six is the least common denominator of the possible feedback frequencies (1=⁶⁄₆, ½=³⁄₆, ⅔=⁴⁄₆).

The cycle qualifier outputs—s0, s1, s2 and s3—are used to: (a) for the phase detector 62, clear the inputs (s2-ph_clr) and latch (s3-ph_latch) data onto the outputs, and (b) for the synchronous counter 64, enable (s0) reading data from the phase detector.

When the DSC is phase locked, there will be at least one cycle out of the six when the feedback and reference clocks have leading (rising) edges that occur simultaneously—the phase detector 62 should be cleared in the cycle before this synchronization edge occurs. After the synchronization edge, up/dn data from the first stage of the phase detector can be latched into the output buffers of the phase detector, and then the synchronous counter 64 can read the up/dn output.

The connection of the cycle qualifier outputs, as well as the number of outputs (phases) will differ from system to system because of different feedback frequencies and reset states. The clrx signal resets the cycle qualifier to state 000.

Figure 4B:
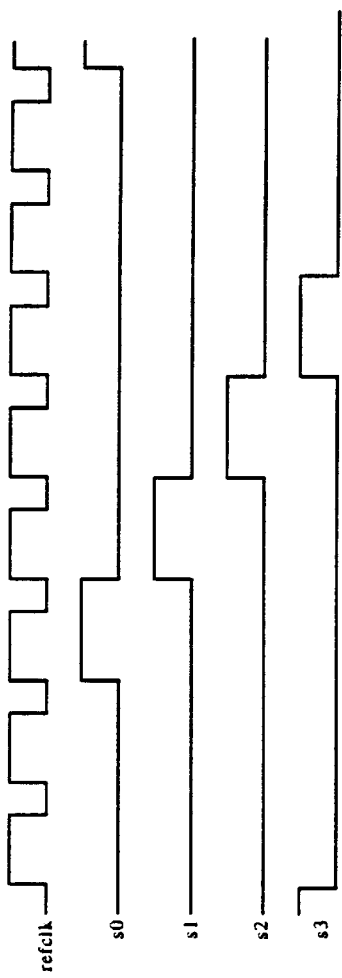
Figure 4C:
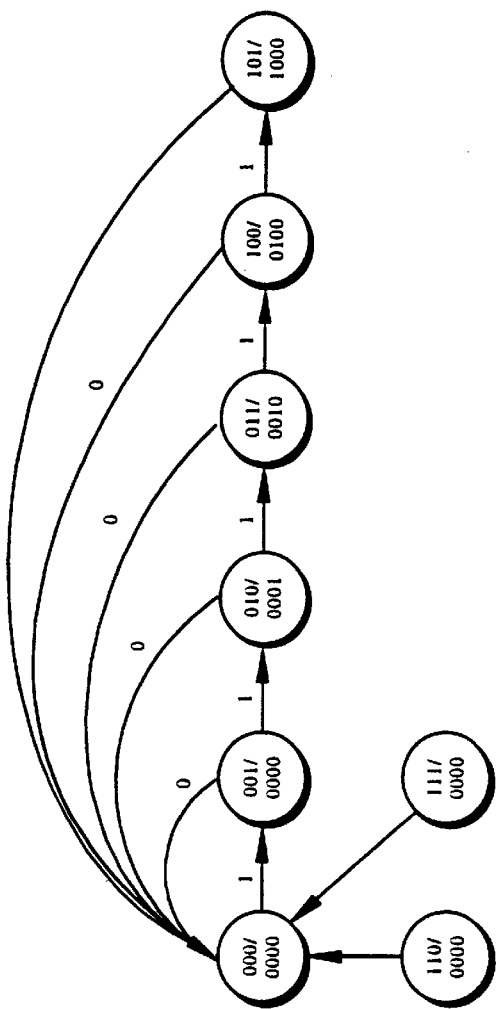

FIGS. 4b and 4c are state and timing diagrams for the exemplary four phase qualifier.

2.2. Phase Detector

Figure 4D:
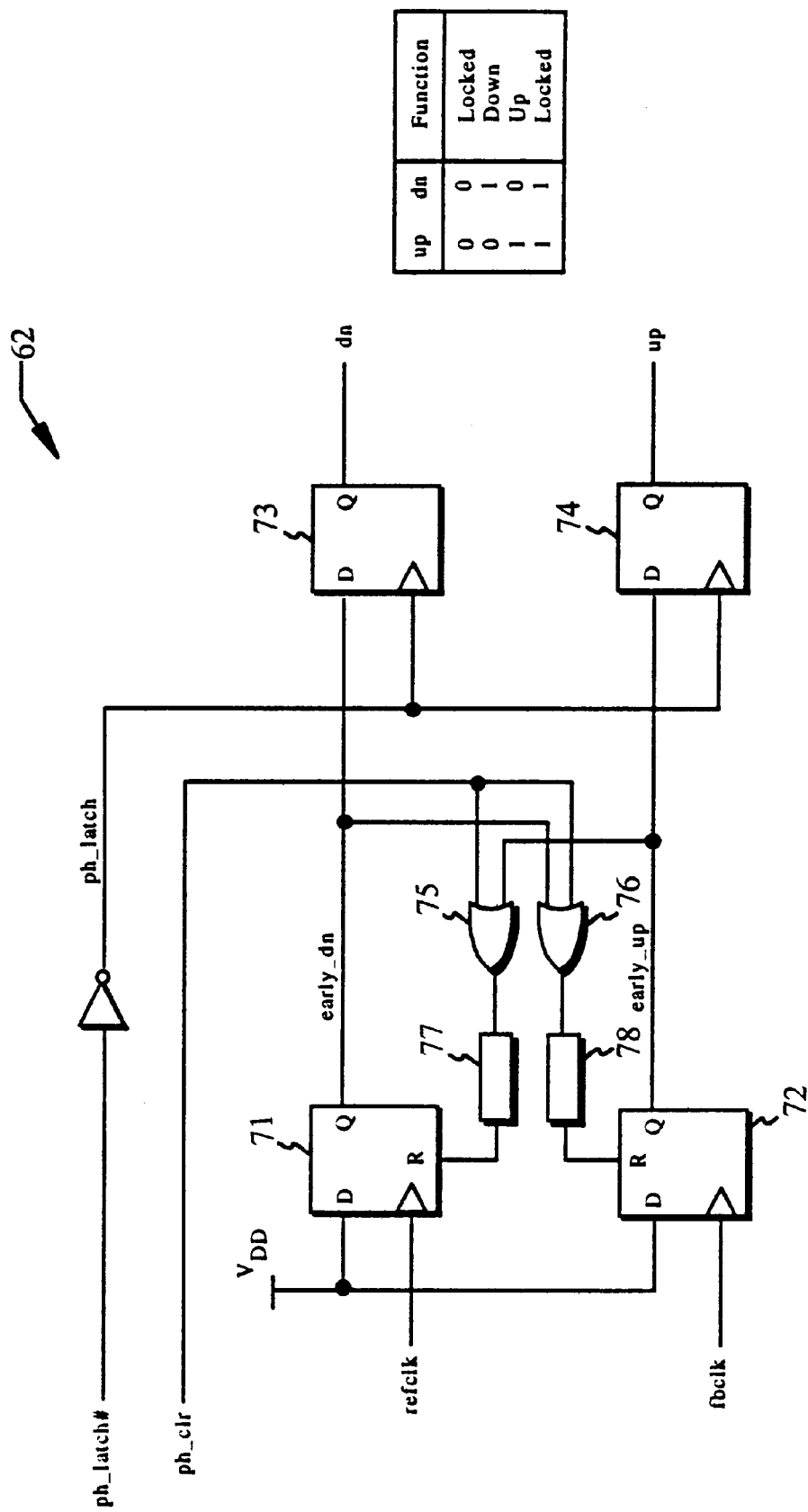

FIG. 4d illustrates an exemplary logic implementation for the phase detector 62. The phase detector is double buffered—input flip-flops 71 and 72 receive the reference clock refclk and feedback clock fbclk, and output flip-flops 73 and 74 are used to provide the up/dn (phase adjustment) data generated by the phase detector.

The phase detector 62 receives ph_clr and ph_latch control signals from the cycle qualifier (68 and FIG. 4a). The ph_clr signal clears the input flip-flops 71 and 72 so that the phase detector can receive new clock data. The ph_latch# signal enables the output flip-flops 73 and 74 to latch the up/dn data.

The up/dn/lock outputs for the phase detector 62 are given by the following table:

| up | dn | Output |
|----|----|--------|
| 0  | 0  | Locked |
| 0  | 1  | Down   |
| 1  | 0  | Up     |
| 1  | 1  | Locked |

For up/dn [01], if the leading edge of refclk occurs before the leading edge of fbclk, then the early_dn output from flip-flop 71 is set, preventing flip-flop 72 from setting early_up on the leading edge of fbclk. For up/dn [10], if the leading edge of fbclk occurs before the leading edge of refclk, then the early_up output from flip-flop 72 is set, and early_dn is cleared.

2.2.1. Phase Lock Signal

In accordance with one aspect of the invention, the phase detector 62 signals when refclk and fbclk are phase locked—the state up/dn [00]. Specifically, if the leading edges of refclk and fbclk clock occur simultaneously, then early_up and early_dn will both be initially set (i.e., [11]), and then both cleared after propagating through respective OR gates 75 and 76 and delay elements 77 and 78—thus, the early_up and early_dn outputs from the input flip-flops 71 and 72 clear to state [00] (phase lock) prior to being latched by flip-flops 73 and 74 (clocked by ph_latch).

As described in Section 2.2.2, the phase lock state [11] is also generated if refclk and fbclk are out of phase by less than a selected amount.

State [11] is a metastable state that is interpreted as phase lock.

2.2.2. Hysteresis

According to one aspect of the invention, the phase detector uses hysteresis in the generation of the up/dn data to avoid signaling phase adjustment, either up/dn [10] or [01], for selectably small deviations from phase lock. Specifically, for the exemplary embodiment, the phase detector will continue to signal the phase lock state [00] unless the phase difference is greater than the delay between taps on the SCDL inverter chain.

The delay elements 77 and 78 are used to provide a selectable amount of hysteresis in the generation of up/dn/lock data. The early_dn and early up outputs from the input flip-flops 71 and 72 (which are latched into respective output flip-flops 73 and 74 as the up/dn data) are cross coupled through OR gates 75 and 76 and delay elements 77 and 78 to the reset inputs for the input flip-flops.

If refclk or fbclk are substantially out of phase, then the early signal latched into a respective input flip-flop will reach the reset input of the other input flip-flop before the late signal is latched into that flip-flop. The resulting early_up and early_dn signals will be [10] or [01], and will be latched into the output flip-flops by ph_latch as output up/dn phase lock data.

By selecting the amount of delay through the delay elements 77 and 78, a corresponding amount of hysteresis can be provided by the phase detector. Specifically, the early signal latched into a respective input flip-flop will be delayed through a respective delay element—if the late signal reaches its input flip-flop before that flip-flop is cleared, then the late signal will also be latched and will clear the other input flip-flop. In this case, what would be an early_up/dn latched input state of [10] or [01] will be converted by the hysteresis effect to a [11] input state, which clears to the phase lock state [00] as described in Section 2.2.1.

2.3. Synchronous Counter

Figure 4E:
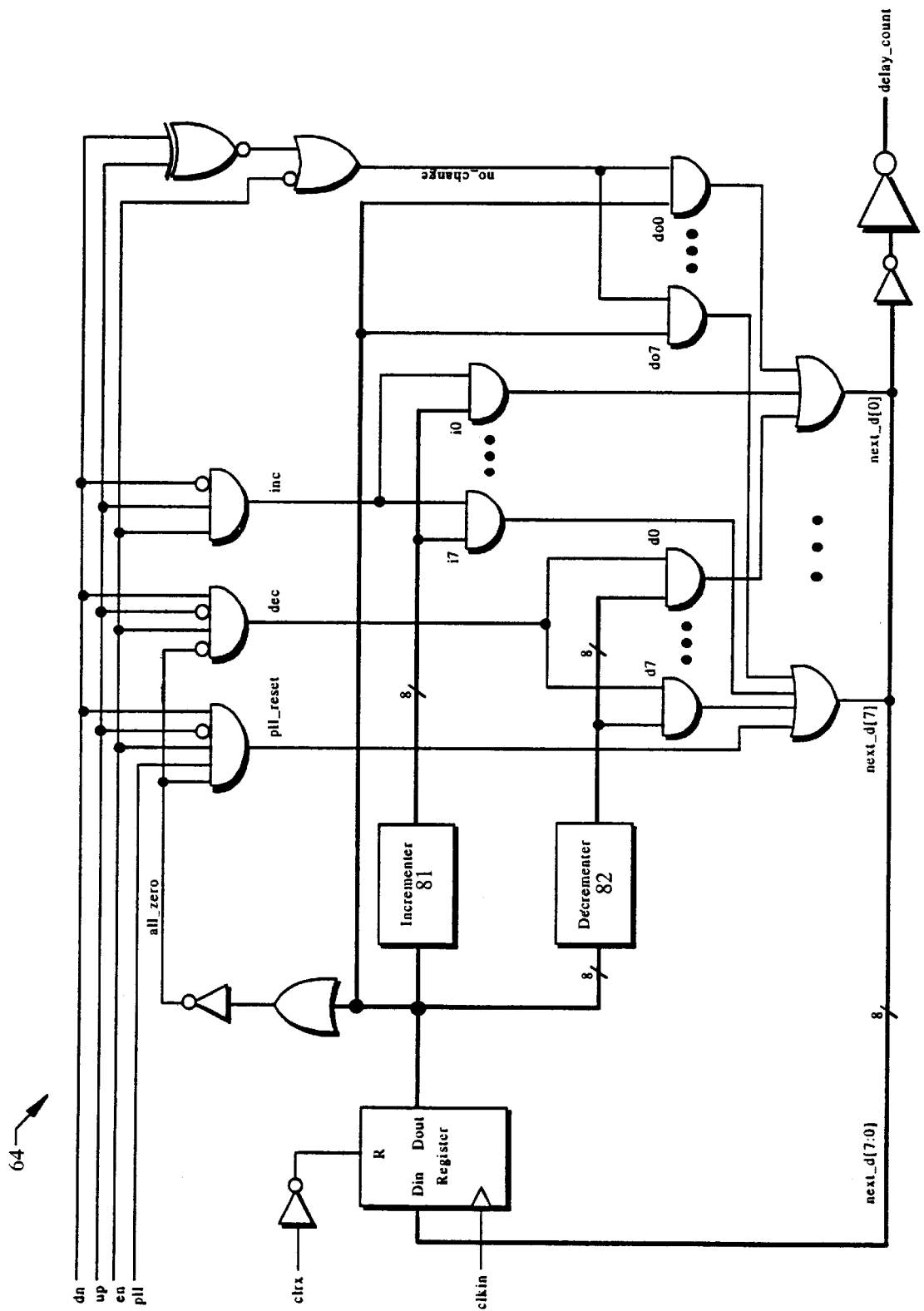

FIG. 4e is an exemplary logic implementation for the synchronous counter 64. The clrx signal resets the counter to all zeroes.

The enable input en (s0 from the cycle qualifier) signals when up/dn/lock data from the phase detector is valid. When enabled, the counter increments delay_count using incrementer 81 when up/dn is [10], and decrements delay_count using decrementer 82 when up/dn is [01]. The count will stay the same when the synchronous counter is not enabled or is when the reference and feedback clocks are locked, which occurs when up/dn is [00] or [11].

An exception is when the counter underflows—that is, the counter is at 00h and count down is signaled by the up/dn phase detector output, which would normally wrap to FFh. For the exemplary DSC, counter underflow is an unstable condition—instead of underflowing to FFh, the count is set to 80 h, which is the middle of the count.

The p11 signal is used to set the counter to the middle of the count for underflow conditions. Thus, with p11 active, the synchronous counter is updated with the value 80 h, generating a delay_count value that places each SCDL in the center of its taps, creating a delay that is one-half of the maximum delay of the SCDL.

If p11 is inactive, the counter will stay at zero in the case of counter underflow (i.e., 00h and count down). This is the condition for the exemplary synchronous counter used in the multiplier (see, Section 3.1).

The logic implementation in FIG. 4e is exemplary—the synchronous counter 62 is defined by the state table in Appendix A.

2.4. Digital Delay Line

Referring to FIGS. 3 and 4a, the SCDLs 55A/55B each receive as a control input cntrl the delay_count output from the DSC control logic 52. Specifically, delay_count is output from the synchronous counter 64 and used to select the amount of skew compensation delay.

Figure 4F:
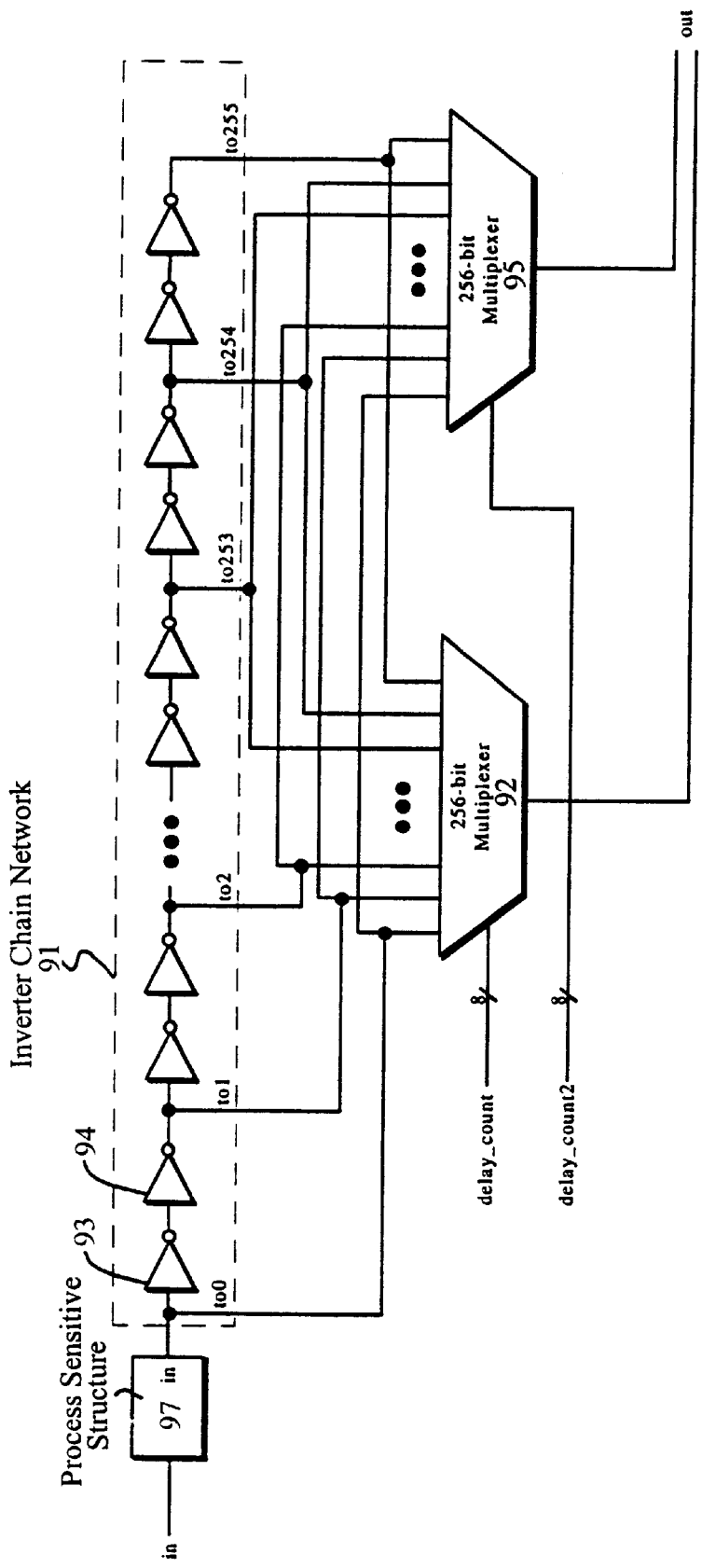

FIG. 4f is an exemplary logic implementation for a skew compensation delay line 55A/55B. Each SCDL includes a tapped inverter chain 91 and an output multiplexer 92.

Multiplexer 92 is responsive to the cntrl input to select the appropriate tap off the inverter chain 91, thereby selecting the appropriate amount of skew-compensation delay through the SCDL. The skew compensation delay determines the propagation time for a leading/trailing edge to propagate from the input of the inverter chain 91 to the output of the multiplexer.

The length of the delay from one end of the inverter chain to the other, to0 to to255 (corresponding to the 8 bit delay_count), is chosen to be approximately equal to the longest period of all the clock waveforms (depending on worst case process variation). In the exemplary system, the longest period is the period of the ½× clock signal.

The total skew-compensation delay introduced by a SCDL 55A/55B can be changed by two different methods: (a) the delay of the inverter pairs can be changed by resizing the transistors that make up the inverter, or (b) the number of inverter pairs can be increased or decreased.

An inverter pair is made up of two cascaded inverters, such as inverters 93 and 94. If the number of inverter pairs is changed, then the multiplexer 92 and the number of bits in the cntrl line will have to be changed to accommodate the number of pairs.

2.4.1. Multiple Delay Outputs

In accordance with one aspect of the invention, in an alternative embodiment, the SCDL is configured to include a second multiplexer 95.

The multiplexer receives each of the tap outputs from the inverter chain 91. A second delay_count2 selects the appropriate tap off the inverter chain for output by the multiplexer. In this alternative embodiment, the SCDL is able to generate two (or more with additional multiplexers) delay outputs using a single inverter chain.

2.4.2. Process Variation Measurement

In accordance with one aspect of the invention, the SCDL is configured to provide process variation measurement.

A process sensitive structure 97, such as a process sensitive configuration of inverters (i.e., including combinations of process layers such as metal 1, metal 2, poly), is included at the front end of the inverter chain 91. The inverter chain 91 is fabricated to be relatively process invariant, such as by using interconnections that use short interconnect wires fabricated with a single level of metal.

As a result, the output from the multiplexer 92 provides an indication of process variation, as indicated by the tap selection on the inverter chain network 91. That is, this tap will have to be changed to compensate for any process variation in the front-end process sensitive structure 97—that change is reflected in the delay_count selection input, which can be latched and used to provide a measure of process variation (such as for preliminary speed grading).

Because the inverter chain 91 is process invariant, the SCDL functions nominally, independent of process variations that affect the process sensitive structure 97.

3. Clock Multiplication

Referring to FIG. 2, the exemplary clock generator includes a programmable clock multiplication network 30. In one aspect of the invention, this network performs fractional multiplication (⅔×) using a programmable clock multiplier 40.

Clock multiplier 40 divides an input clock period into N equal clock pulse components—the appropriate combination of these components provides a generated output clock with the desired multiplication. The programmable multiplier is fully digital, and permits symmetry in clock duty cycle to be maintained.

FIG. 5a illustrates the exemplary programmable multiplier 40 implemented for multiply-by-two—FIG. 5b illustrates the extension to multiply-by-N.

Referring to FIG. 5a, the multiplier 40 includes a synchronous delay line 100 and an output waveform generator 105. The synchronous delay line (SDL) generates eight non-overlapping SDL clock pulses during each period of the input clock clkin (i.e., the ph1 clock generated by the digital skew compensator)—the SDL pulses are designated d0–d7 (see, Section 3.1.1).

For the exemplary 2× multiplier, four of these SDL pulses—d0, d2, d4, and d6—are input to the waveform generator 105, which in response generates the necessary clock edges to provide an output clkout signal that is 2× the input clkin with a 50% duty cycle.

3.1. Synchronous Delay Line

FIGS. 6a and 6b illustrate a logic implementation and timing diagram for the exemplary SDL 100.

A tapped pulse generator network 110 generates non-overlapping SDL pulses using cascaded pulse generator delay elements 111–118 and associated add and truncate circuits 121–128. The first delay element 111 receives the input clkin—the succeeding delay elements 112–118 are clocked by the output from the previous delay element.

SDL pulses d0#–d7# are tapped off of the outputs of respective delay elements. FIG. 6b illustrates the pulses d0–d7 in reference to clkin.

In the case of the delay element 111, the leading (rising) edge of clkin triggers the delay element to drop its output low, generating a leading edge of the SDL pulse d0#. The output stays low for a time determined by the sel (delay selection) input—the output then transitions high, generating the trailing edge of SDL pulse d0#.

When the output of delay element 111 transitions low to high, the delay element 112 is triggered to transition its output low, generating the leading edge of the next SDL pulse d1#. The sel input causes delay element 112 to transition high, generating the trailing edge of d1#.

This pulse generation process cascades through the remaining delay elements, generating the sequence of SDL pulses d0#–d7# illustrated in FIG. 6b.

The width of each SDL pulse d0#–d7#, as determined by the sel inputs to the corresponding delay elements 111–118, should be such that the trailing edge of d7# and the leading edge of clkin occur simultaneously, synchronizing SDL pulse generation to the clkin period. These sel inputs are provided by respective add and truncate circuits 121–128, with control being provided by a synchronous counter 132 and SDL control logic 134.

The SDL control logic 134 compares the edges of clkin and the feedback clock fbclk from the output of the last delay element 118, and provides dn/up data for the synchronous counter 132. The counter provides an output count to each of the add and truncate circuits 121–128 which generate the delay selection signal set to respective delay elements.

The synchronous counter 132 is identical to the synchronous counter described in Section 2.3 (64 is FIGS. 4a and 4e). If the leading edge of clkin occurs before the trailing edge of SDL pulse d7#, the counter is decremented. If the leading edge of d7# occurs first, the counter is incremented. If the edges occur simultaneously (within the hysteresis bounds established by the phase detector in the SDL control logic), the counter maintains its current value. (See, Section 3.1.1)

Note that the SDL pulse sequence is synchronized to the input clkin period, ensuring that the multiplier will be synchronized to the first harmonic of clkin.

Referring to FIG. 4e, for the exemplary use of the synchronous counter in the multiplier SDL, the p11 signal is inactive. As a result, for underflow conditions (i.e., where the counter is as 00h and up/dn indicates count down), the synchronous counter will stay at 00h—at 00h, the synchronous counter is already signaling the narrowest pulse width attainable for the SDL pulses (if narrower SDL pulses are needed to achieve synchronization, then the frequency is too high for the SDL).

The count from synchronous counter 132 is input to each add and truncate (A&T) circuit 121–128 (the A input) and added to a base value (the B input), and then truncated. Small differences in the A&T circuits result in some SDL pulse width variation (one inverter pair)—this variation enables the A&T circuits to be fine tuned for locking the trailing edge of SDL pulse d7# to the leading edge of clkin.

The base value on input B is unique for each A&T circuit, and ranges from 0–7 (one value for each A&T circuit).

Referring to FIGS. 5a and 6b, the exemplary 2× multiplier 40 uses four of the SDL pulses—d0, d2, d4, and d6—to generate a 2× output clock from the waveform generator 105 with a 50% duty cycle. Thus, for multiply-by-N (FIG. 5b), 2N SDL pulses are required for a 50% duty cycle.

If more control is needed over the duty cycle, then the design trade-off is that either the SDL 100 must generate more SDL pulses, or the maximum output frequency must be reduced. In particular, for duty cycles other than 50%, the following procedure can be used to determine the minimum number of pulses needed in the SDL: (a) convert the duty cycle from a percentage to a fraction, (b) reduce the fraction, and (c) multiply the numerator by the denominator to get the number of pulses required in the SDL. For example, for a 5× multiplier with 75% duty cycle, convert 75% to 75/100, reduce to ¾, and multiply N by the denominator (5*4)—twenty non-overlapping pulses would be required in the SDL.

3.1.1. SDL Control Logic

Figure 7A:
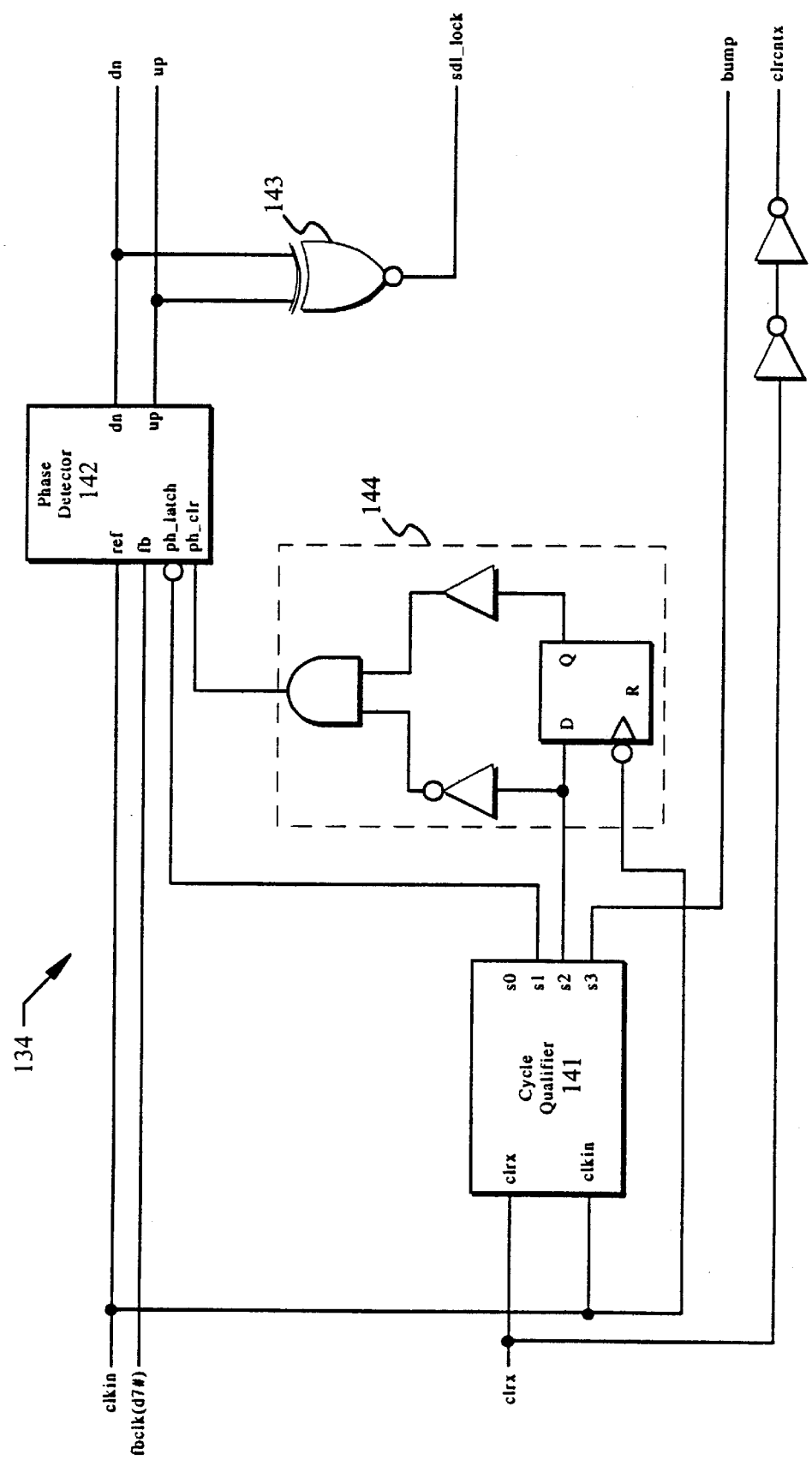

FIG. 7a illustrates the exemplary SDL control logic 134. The SDL control logic includes a four phase cycle qualifier 141, and a phase detector 142—these components are identical to the cycle qualifier and phase detector in digital skew compensator described in Sections 2.1 and 2.2 (FIGS. 4a and 4d).

The phase detector 142 compares arrival times of the leading edges of the input clkin and the feedback fbclk (i.e., SDL pulse d7#). When the arrival times are simultaneous, the SDL is locked, and the up/dn phase detector outputs will be such that the synchronous counter (132 in FIG. 6a) will maintain its current count output. Subject to the effect of hysteresis, when the leading (rising) edge of the clkin arrives first, the phase detector provides a dn output and the counter decrements the count output. When the trailing edge of d7# arrives first, the phase detector provides an up output, and the counter increments the count output.

As with the phase detector in the DSC, the phase detector 142 uses hysteresis in the generation of the up/dn/lock outputs to achieve phase locking between clkin and d7# while minimizing jitter in the counter output.

The exclusive-nor gate 143 provides an SDL lock signal sdl_lock indicating whether the phase detector is signaling a phase lock condition.

The cycle qualifier 141 sequences the events of the phase detector 142, and enables the synchronous counter (132 in FIG. 6a) when data from the phase detector is valid, i.e., when the output signal (s3) bump is active. The trigger circuitry 144 is used to trigger the ph_clr input to the phase detector on the trailing edge of s2, allowing data from the first stage of the phase detector to be latched into the output stage before it is cleared.

The clrx signal and its buffered version, clrcntx, are used to clear the cycle qualifier 141 and the synchronous counter during a reset

3.1.2. Add and Truncate

Figure 7B:
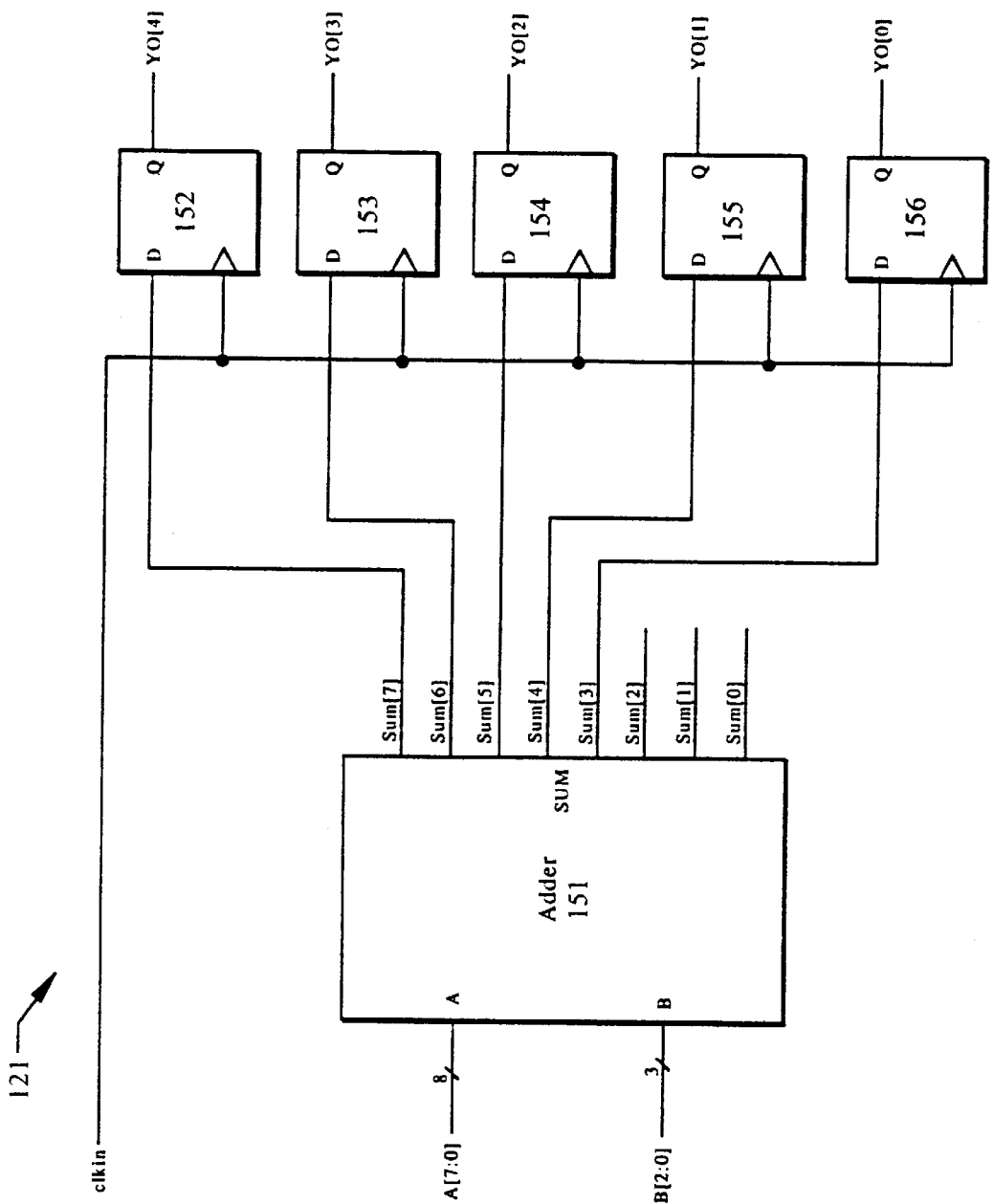

FIG. 7b illustrates an exemplary add and truncate circuit 121 (all of the A&T circuits 121–128 are identical). The adder 151 adds the 8-bit count output (input A) from the synchronous counter (142 in FIG. 6a) and a 3-bit base value (input B), to get an 8-bit result—the most significant five bits of the result are latched into the output register formed by flip-flops 152–156 on a leading edge from the clkin signal.

The exemplary A&T circuit is optimized for an SDL with eight non-overlapping SDL pulses, and a delay element (e.g., 111 in FIG. 6a) with a chain circuit (see, Section 3.1.3) with 32 delay links. The number of pulses determine the number of bits in the base value, and also the number of bits that are truncated from the sum—the equation describing this relation is:

$$\lceil \log_2(\text{pulses}) \rceil$$

where pulses is the number of non-overlapping SDL pulses. The number of flip-flops in the output register (flip-flops 152–156), and hence the number of bits that are not truncated, are given by:

$$\lceil \log_2(\text{links}) \rceil$$

where links is the number of delay links in the chain circuit.

3.1.3. Delay Element

Figure 7C:
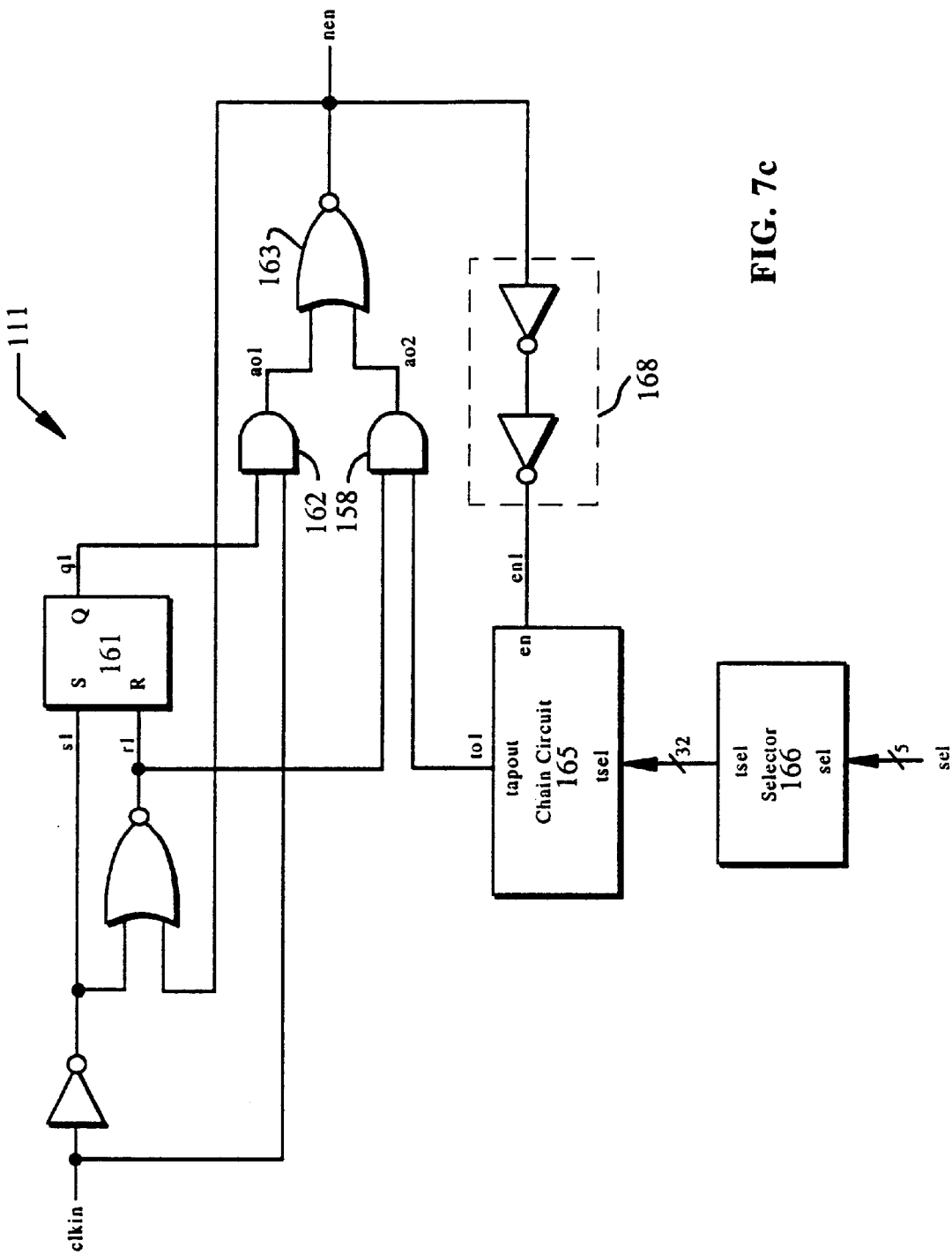
Figure 7D:
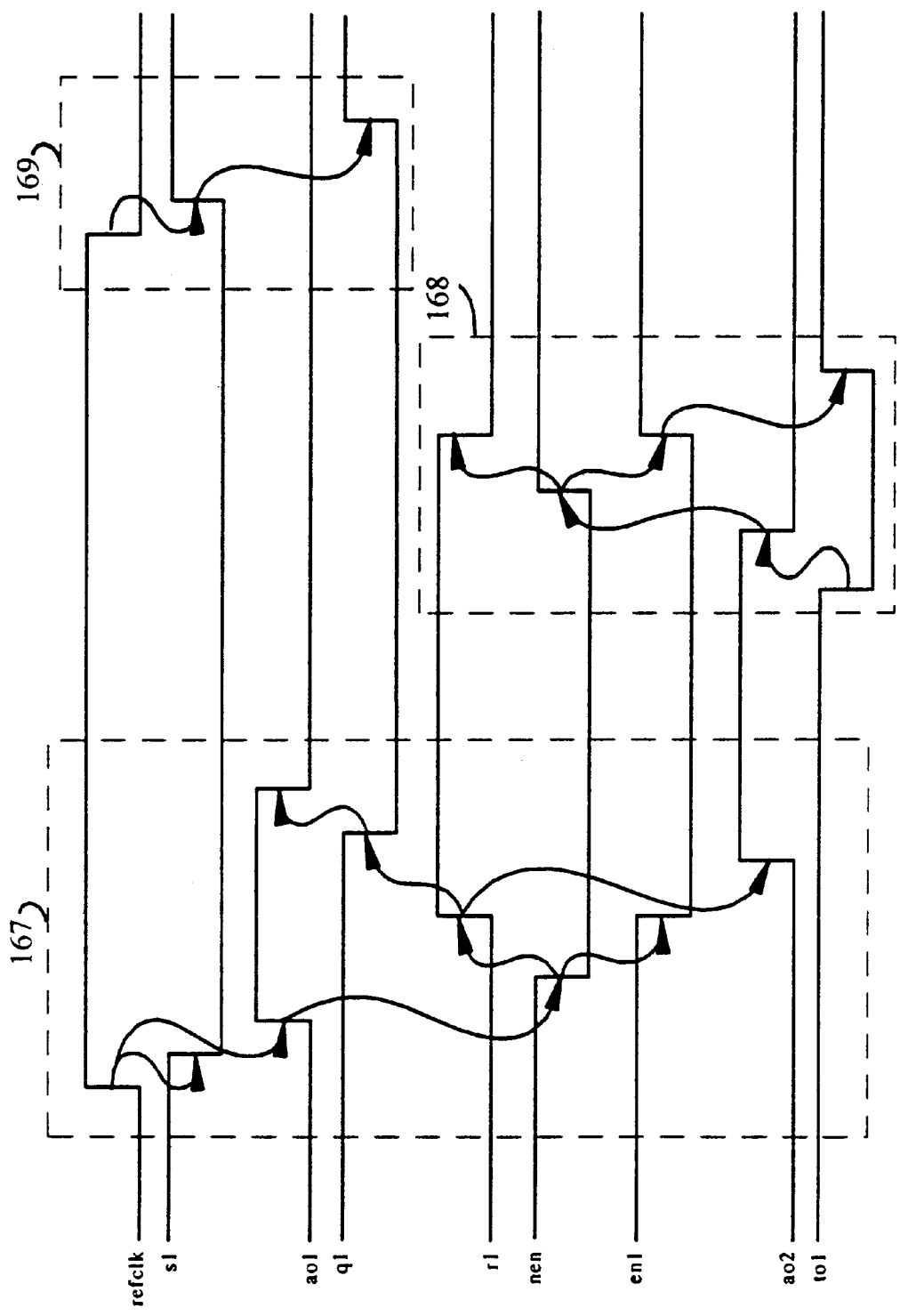

FIGS. 7c and 7d illustrate a logic implementation and timing diagram for an exemplary delay element 111 (each of the delay elements 111–118 in FIG. 6a are identical). The delay elements together form a tapped pulse generation network used to generate the SDL pulses d0#–d7#—SDL pulse width is controlled by the sel (delay selection) input to the delay element.

A leading edge of clkin causes flip-flop 161 and gates 162 and 163 to transition the nen output of the delay element low, generating the leading edge of the SDL pulse.

This nen output transition also triggers a 32-bit wide chain circuit 165. After a predetermined delay, the chain circuit 165 generates an output tapout that causes the delay element output nen to transition high, generating the trailing edge of the SDL pulse.

The amount of delay introduced by the chain circuit 165, and therefore the pulse width of the SDL pulse, is determined by a selector circuit 166 responsive to the sel input—sel is provided to the delay element by the associated add and truncate circuit (121 in FIG. 6a). The sel input is translated by the selector circuit into the length of delay for the chain circuit.

The delay element is reset to the initial state on the trailing edge of clkin. Referring to the timing diagram in FIG. 7d, generation of the leading edge of the SDL pulse is illustrated by transition arrows 167, and generation of the trailing edge of the SDL pulse is illustrated by transition arrows 168. Reset is illustrated by transition arrows 169.

Appendix B sets forth an exemplary selector truth table. The selector has a five bit sel input and a thirty-two bit control output reflecting that the exemplary chain circuit 165 has thirty-two delay links. The size of the selector circuit can be changed so long as all output bits greater than the input value are zero and all output bits less than or equal to the input value are 1.

Figure 7E:
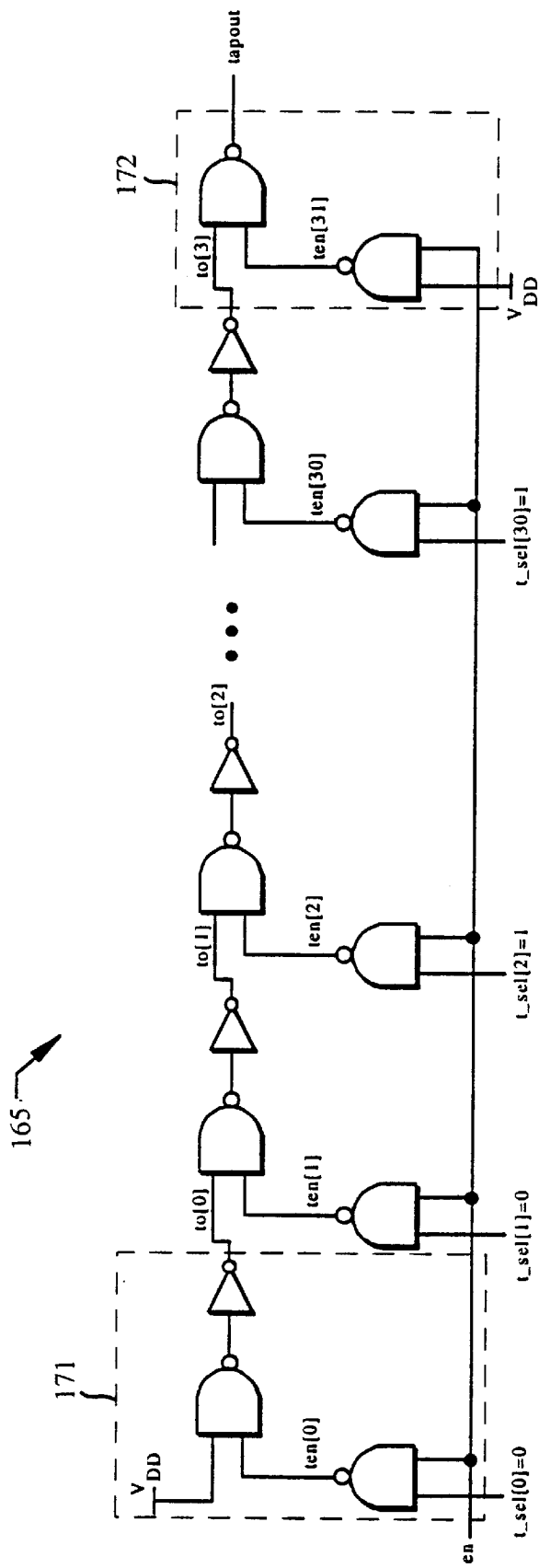
Figure 7F:
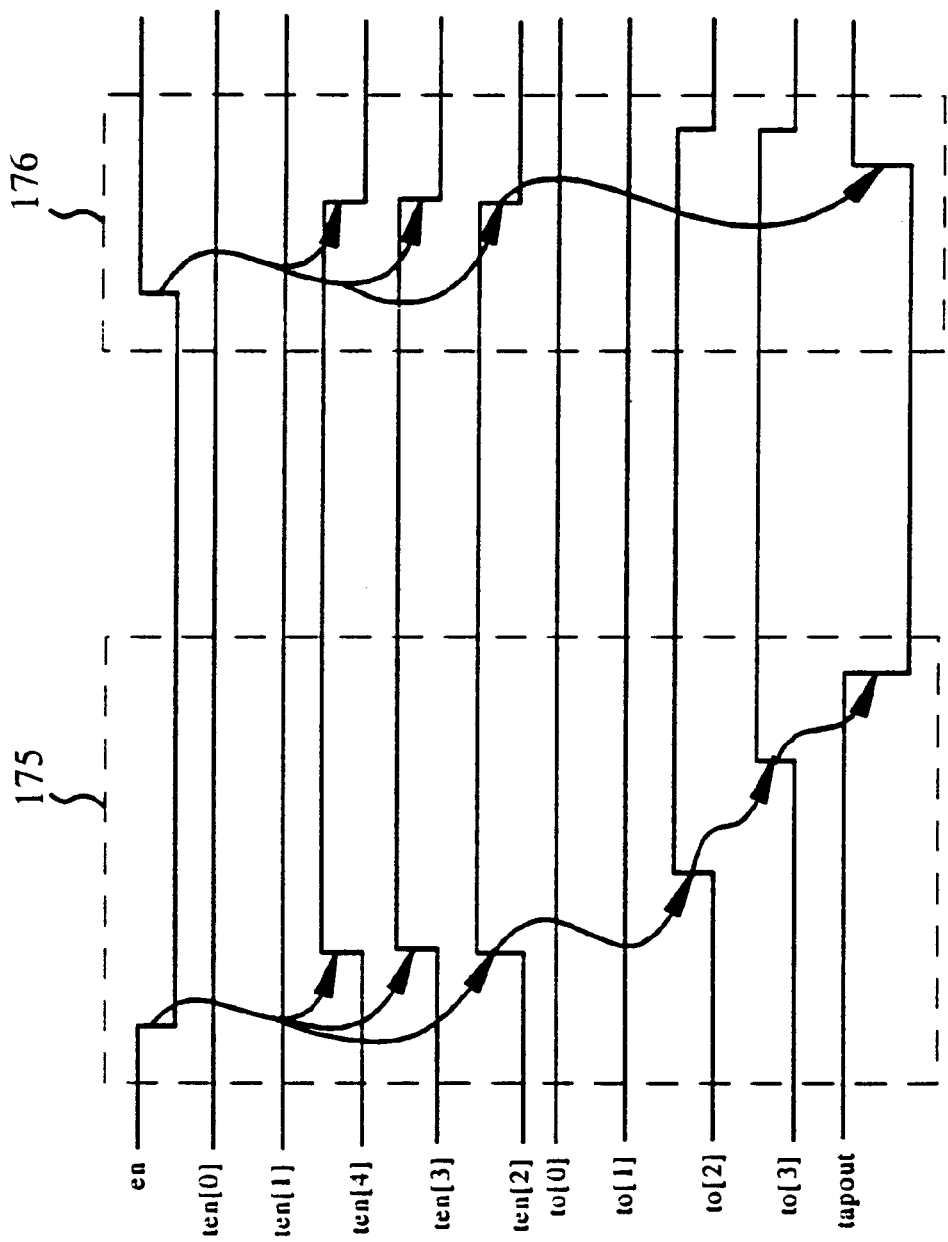

FIGS. 7e and 7f illustrate a logic implementation and timing diagram for the exemplary 32-bit wide chain circuit 165. Each delay link 171 of the chain circuit is made up of two NAND gates and an inverter, except that the last link 172 has only two NAND gates. In general, the number of delay links should equal the maximum period divided by the number of pulses.

A delay link is off when its input tsel is [0]—the most significant delay link 171 is connected to Vdd, and is always on. When a delay link is off, its output to is [1], which effectively removes the delay link from the circuit. Referring to FIGS. 7c and 7e, the chain circuit 165 is started on the trailing edge of the en input. This en signal does not affect the off delay links, but starts a propagation chain beginning with the first on delay link. Thus, for the example in FIG. 7e where ten[2] is the first on delay link, the trailing edge of en causes ten[2]–ten[31] to go high—when ten[2] goes high, the associated link output to[2] goes high which propagates down the chain until ten[30] going high causes the noninverted output tapout to go low. Tapout will stay low until a leading edge from en causes ten[31] to go low.

Referring to FIG. 7f, the leading and trailing edge transitions of tapout are illustrated respectively by transition arrows 175 and 176.

3.2. Waveform Generator

Referring to FIG. 5a, the exemplary programmable 2× multiplier uses waveform generator 105 to generate a 2× output clock clkout using the SDL pulses output from the SDL 100. The SDL pulses—d0#, d2#, d4#, and d6#—are input respectively to the d0#–d3# inputs to the waveform generator.

FIGS. 8a and 8b illustrate a logic implementation and timing diagram for the exemplary waveform generator 105.

The input SDL pulses appearing as waveform generator inputs d0#–d3# are inverted to yield inputs d0–d3. When the even numbered inputs d0 and d2 are high, clkout is high. When the odd inputs d1 and d3 are high, clkout is low.

The input SDL pulses are non-overlapping, but there may be some dead time between pulses—flip-flop 181 ensures that the output waveform will not change during the dead-time.

The exemplary waveform generator 105 generates a 2× clkout with a 50% duty cycle—the even input signals are ORed together and used as the reset input on the flip-flop 181, and the odd inputs are ORed together and used as the set input. Other duty cycles can be produced by the appropriate choice of SDL pulses for input to the waveform generator (and the corresponding selection of the appropriate input logic).

3.3. Fractional Multiplication

In accordance with one aspect of the invention, the clock multiplier of the invention can be used to provide fractional multiplication.

Referring to FIG. 2, the exemplary clock generator implements fractional ⅔× clock multiplication by combining the 2× clock multiplier 40 with a divide-by-three circuit 38. The divide-by-three circuit is conventional—it divides the clock generated by the digital skew compensator 24 for input to the 2× clock multiplier.

Referring to FIG. 5a, the clock multiplier could be used to directly provide fractional multiplication through the appropriate selection of the SDL clock pulses output by the SDL 100, and the appropriate configuration of the waveform generator 105. The design trade-off is in complexity of the waveform generator design.

4. Conclusion

Although the Detailed Description of the invention has been directed to certain exemplary embodiments, various modifications of these embodiments, as well as alternative embodiments, will be suggested to those skilled in the art. In particular, the phase detector and digital delay line elements have general applicability to circuits other than clock generation and multiplication. Various modifications based on trade-offs between hardware and software logic will be apparent to those skilled in the art.

The invention encompasses any modifications or alternative embodiments that fall within the scope of the claims.

APPENDIX A
FIG. 5d
State Table for Synchronous Counter

| Inputs | | | | | Present State | Next State | Comments |
|---|---|---|---|---|---|---|---|
| clrx | pll | en | up | dn | doutf [7:0] | [7:0] | |
| 0 | X | X | X | X | X | 0 | Reset counter to 0 |
| 1 | X | 0 | X | X | A | A | Not enabled |
| 1 | X | 1 | 1 | 0 | A | A + 1 | Increment counter |
| 1 | X | 1 | 0 | 1 | B | B − 1 | Decrement counter |
| 1 | 1 | 1 | 0 | 0 | 0 | 80h | Reset counter for PLL |
| 1 | 0 | 1 | 0 | 1 | 0 | 0 | Leave at zero |
| 1 | X | 1 | 1 | 1 | A | A | PLL locked |
| 1 | X | 1 | 0 | 0 | A | A | PLL locked |

A is any unsigned 8-bit integer (0–255).
B is any unsigned 8-bit integer except 0 (1–255).
The asynchronous input clrx is used to reset the counter to all zeroes. Clrx is an active low input.
All events are triggered on the positive going edge of clkin except for during a reset which is caused by the asynchronous input clrx FIG. 11f
Truth Table for the Selector used in Delay Element

| sel [4:0] | tsel [0:30] |
|---|---|
| 00000 | 0000000000000000000000000000000 |
| 00001 | 0000000000000000000000000000001 |
| 00010 | 0000000000000000000000000000011 |
| 00011 | 0000000000000000000000000000111 |
| 00100 | 0000000000000000000000000001111 |
| 00101 | 0000000000000000000000000011111 |
| 00110 | 0000000000000000000000000111111 |
| 00111 | 0000000000000000000000001111111 |
| 01000 | 0000000000000000000000011111111 |
| 01001 | 0000000000000000000000111111111 |
| 01010 | 0000000000000000000001111111111 |
| 01011 | 0000000000000000000011111111111 |
| 01100 | 0000000000000000000111111111111 |
| 01101 | 0000000000000000001111111111111 |
| 01110 | 0000000000000000011111111111111 |
| 01111 | 0000000000000000111111111111111 |
| 10000 | 0000000000000001111111111111111 |
| 10001 | 0000000000000011111111111111111 |
| 10010 | 0000000000000111111111111111111 |
| 10011 | 0000000000001111111111111111111 |
| 10100 | 0000000000011111111111111111111 |
| 10101 | 0000000000111111111111111111111 |
| 10110 | 0000000001111111111111111111111 |
| 10111 | 0000000011111111111111111111111 |
| 11000 | 0000000111111111111111111111111 |

What is claimed is:

1. In a system using a reference clock with a reference frequency, a clock multiplier that generates a multiplied clock with a frequency that is a multiple of the reference frequency of the reference clock, comprising:

(a) a pulse generator network of N pulse cascaded generators PG1–PGN, with the output of each pulse generator PG1–PG(N−1) being respectively coupled to the input of the next pulse generator PG2–PGN;

(b) the pulse generators, when triggered, respectively generating pulses P1–PN, each with a leading edge and a trailing edge, and a pulse width determined by a selectable pulse-width delay signal;

(c) the pulse generator PG1 being triggered by a leading edge of the reference clock, and the remaining pulse generators PG2–PGN being triggered by the trailing edge of the pulse P from the previous pulse generator;

(d) a synchronization circuit, coupled to the pulse generator PGN, that detects phase deviations between the trailing edge of the pulse PN from pulse generator PGN and the leading edge of the reference clock, and provides a corresponding phase adjustment signal;

(e) a pulse-width delay selection circuit coupled to at least one of the pulse generators PG1–PGN and responsive to the phase adjustment signal to correspondingly adjust the pulse-width delay signal for the at least one of the pulse generators PG1–PGN so as to achieve phase locking between the reference clock and the pulse PN generated by the pulse generator PGN;

(f) such that, for each period of the reference clock, the pulse generator network generates a sequence of non-overlapping pulses P1–PN; and (g) a waveform generator responsive to selected ones of the pulses P1–PN to generate the multiplied clock with clock edges defined by such selected ones of the pulses P1–PN.

2. In a system using a reference clock with a reference frequency, a clock multiplier that generates a multiplied clock with a frequency that is a multiple of the reference frequency, comprising:

(a) a pulse generator means for generating a sequence of non-overlapping pulses P1–PN;

(b) the pulse generator means including N cascaded pulse generators PG1–PGN, with the output of each pulse generator PG1–PG(N−1) being respectively coupled to the input of the next pulse generator PG2–PGN;

(c) the pulse generators, when triggered, respectively generating the pulses P1–PN, each with a leading edge and a trailing edge, and a pulse width determined by a selectable pulse-width delay signal;

(d) the pulse generator PG1 being triggered by a leading edge of the reference clock, and the remaining pulse generators PG2–PGN being triggered by the trailing edge of the pulse P from the previous pulse generator;

(e) synchronization means for detecting phase deviations between the trailing edge of the pulse PN from pulse generator PGN and the leading edge of the reference clock, and providing a corresponding phase adjustment signal;

(e) pulse-width delay selection means responsive to the phase adjustment signal for correspondingly adjusting the pulse-width delay signal for at least one of the pulse generators PG1–PGN so as to achieve phase locking between the reference clock and the pulse PN generated by the pulse generator PGN;

(f) such that, for each period of the reference clock, the pulse generator means generates the sequence of non-overlapping pulses P1–PN; and (g) waveform generator means for generating, using selected ones of the pulses P1–PN, the multiplied clock with clock edges defined by such selected ones of the pulses P1–PN.

3. A method of clock multiplication used to generate from a reference clock with a reference frequency a multiplied clock with a frequency that is a multiple of the reference frequency, comprising:

(a) generating a sequence of non-overlapping pulses P1–PN using N cascade-coupled pulse generators PG1–PGN, each of the pulses P1–PN having a leading edge and a trailing edge, and a pulse width determined by a selectable pulse-width delay signal, the pulse generator PG1 being triggered by a leading edge of the reference clock, and the remaining pulse generators PG2–PGN being triggered by the trailing edge of the pulse P from the previous pulse generator;

(b) detecting phase deviations between the trailing edge of the pulse PN from pulse generator PGN and the leading edge of the reference clock, and providing a corresponding phase adjustment signal;

(b) responsive to the phase adjustment signal, adjusting the pulse-width delay signal for at least one of the pulse generators PG1–PGN so as to achieve phase locking between the reference clock and pulse PN generated by the pulse generator PGN;

(c) thereby generating, for each period of the reference clock, the sequence of non-overlapping pulses P1–PN; and (d) generating, using selected ones of the pulses P1–PN, the multiplied clock with clock edges defined by such selected ones of the pulses P1–PN.

\* \* \* \* \*